United States Patent
Bottomley et al.

(10) Patent No.: US 9,494,668 B2
(45) Date of Patent: Nov. 15, 2016

(54) SYSTEMS AND METHODS FOR MEASURING NUCLEAR MAGNETIC RESONANCE SPIN-LATTICE RELAXATION TIME $T_1$ AND SPIN-SPIN RELAXATION TIME $T_2$

(71) Applicant: The Johns Hopkins University, Baltimore, MD (US)

(72) Inventors: Paul A. Bottomley, Baltimore, MD (US); Guan Wang, Baltimore, MD (US); Abdel-Monem M. El-Sharkawy, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 1012 days.

(21) Appl. No.: 13/692,726

(22) Filed: Dec. 3, 2012

(65) Prior Publication Data

US 2013/0141096 A1    Jun. 6, 2013

Related U.S. Application Data

(60) Provisional application No. 61/566,265, filed on Dec. 2, 2011.

(51) Int. Cl.
*G01V 3/00* (2006.01)
*G01R 33/50* (2006.01)
*G01R 33/54* (2006.01)

(52) U.S. Cl.
CPC .............. *G01R 33/50* (2013.01); *G01R 33/54* (2013.01)

(58) Field of Classification Search
CPC ..................................................... G01R 33/50
USPC .......................................... 324/309, 307, 314
See application file for complete search history.

(56) References Cited

U.S. PATENT DOCUMENTS

| | | | |
|---|---|---|---|
| 4,484,138 A | 11/1984 | Bottomley et al. | |
| 4,521,733 A | 6/1985 | Bottomley et al. | |
| 6,064,203 A * | 5/2000 | Bottomley | G01R 33/50 324/307 |
| 8,502,537 B2 * | 8/2013 | Corum | G01R 33/4816 324/314 |

(Continued)

OTHER PUBLICATIONS

Bendall et al., Adiabatic refocusing pulse which compensates for variable of power and off-resonance effects, Magnetic Resonance in Medicine, 4 (1987) 493-499.

(Continued)

*Primary Examiner* — Louis Arana
(74) *Attorney, Agent, or Firm* — Venable LLP; Henry J. Daley

(57) ABSTRACT

A system for measuring nuclear magnetic resonance spin-lattice relaxation time $T_1$ and spin-spin relaxation time $T_2$ of a sample includes a source of a substantially uniform magnetic field $B_0$ for immersing at least a portion of the sample; a nuclear magnetic resonance excitation and detection system constructed and arranged to excite at least a portion of the sample with a plurality of nuclear magnetic resonance pulse sequences, each applied with a repetition time that is preselected to be sensitive to a $T_1$ value of at least a portion of the sample, and to detect nuclear magnetic resonance emissions from the sample in response to excitations to provide a plurality of detection signals; and a signal processing system configured to communicate with the nuclear magnetic resonance excitation and detection system to receive the plurality of detection signals.

50 Claims, 23 Drawing Sheets

(56) References Cited

U.S. PATENT DOCUMENTS

| | | | |
|---|---|---|---|
| 2005/0024052 A1* | 2/2005 | Bendall | G01R 33/4616 324/307 |
| 2006/0253015 A1* | 11/2006 | Nezafat | G01R 33/5635 600/410 |
| 2006/0284615 A1* | 12/2006 | Nazafat | G01R 33/5635 324/307 |
| 2012/0146639 A1* | 6/2012 | Sorensen | G01R 33/4633 324/309 |

OTHER PUBLICATIONS

Bittoun et al., A computer algorithm for the simulation of any Nuclear Magnetic Resonance (NMR) imaging method, Magnetic Resonance Imaging, 2 (1984) 113-120.

Bottomley, R. Ouwerkerk, BIRP: an improved implementation of low-angle adiabatic (BIR-4) excitation pulses, J. Magn. Reson. Ser. A, 103 (1993) 242-244.

Bottomley et al., The Dual-Angle Method for Fast, Sensitive T1 Measurement in Vivo with Low-Angle Adiabatic Pulses, Journal of Magnetic Resonance, Series B, 104 (1994) 159-167.

De Graaf, K. Nicolay, Adiabatic rf pulses: Applications to in vivo NMR, Concepts in Magnetic Resonance, 9 (1997) 247-268.

Deoni, High-resolution T1 mapping of the brain at 3T with driven equilibrium single pulse observation of T1 with high-speed incorporation of RF field inhomogeneities (DESPOT1-HIFI), Journal of Magnetic Resonance Imaging, 26 (2007) 1106-1111.

El-Sharkawy et al., Quantitative Cardiac 31P Spectroscopy at 3 Tesla Using Adiabatic Paulses, Magnetic Resonance in Medicine, 61 (2009).

Ethofer et al., Comparison of longitudinal metabolite relaxation times in different regions of the human brain at 1.5 and 3 Tesla, Magnetic Resonance in Medicine, 50 (2003) 1296-1301.

Garwood, Symmetric pulses to induce arbitrary flip angles with compensation for rf inhomogeneity and resonance offsets, J. of Magnetic Resonance (1969), 94 (1991) 511-525.

Gelman et al., MR Imaging of Human Brain at 3.0 T: Preliminary Report on Transverse Relaxation Rates and Relation to Estimated Iron Content, Radiology, 210 (1999) 759-767.

Gold et al., Musculoskeletal MRI at 3.0 T: Relaxation Times and Image Contrast, Am. J. Roentgenol., 183 (2004) 343-351.

Hardy et al., Efficient adiabatic fast passage for NMR population inversion in the presence of radiofrequency field inhomogeneity and frequency offsets, J. Mag. Reson., 66 (1986) 470-482.

Meiboom, D. Gill, Modified Spin? Echo Method for Measuring Nuclear Relaxation Times, Review of Scientific Instruments, 29 (1958) 688-691.

Moran, Near-resonance spin-lock contrast, Magnetic Resonance Imaging, 13 (1995) 837-846.

Naressi et al., Java-based Graphical User Interface for the MRUI Quantitation Package, MAGMA, 12 (2001) 141-152.

Nezafat et al., Spectrally selective B1-insensitive T2 magnetization preparation sequence, Magnetic Resonance in Medicine, 61 (2009) 1326-1335.

Norris, Adiabatic radiofrequency pulse forms in biomedical nuclear magnetic resonance, Concepts in Magnetic Resonance, 14 (2002) 89-101.

Silver et al., Highly selective [pi]/2 and [pi] pulse generation, J. Mag. Reson. (1969), 59 (1984) 347-351.

Stanisz et al., T1, T2 relaxation and magnetization transfer in tissue at 3T, Magnetic Resonance in Medicine, 54 (2005) 507-512.

Venkatesan et al., Accurate determination of spin-density and T1 in the presence of RF-field inhomogeneities and flip-angle miscalibration, Magn. Reson. in Medicine, 40 (1998) 592-602.

Wang et al., Measuring T2 and Ti, and imaging T2 without spin echoes, J. Magn. Reson., 214 (2012) 273-280.

Wansapura et al., NMR relaxation times in the human brain at 3.0 tesla, Journal of Magnetic Resonance Imaging, 9 (1999) 531-538.

Yarnykh, Actual flip-angle imaging in the pulsed steady state: A method for rapid three-dimensional mapping of the transmitted radiofrequency field, Magnetic Resonance in Medicine, 57 (2007) 192-200.

Yoshimura et al., Development of a tissue-equivalent MRI phantom using carrageenan gel, Magnetic Resonance in Medicine, 50 (2003) 1011-1017.

Nezafat et al., "$B_1$-insensitive $T_2$ preparation for improved coronary magnetic resonance angiography at 3 T," Magnetic Resonance in Medicine, vol. 55: 858-864 (2006).

* cited by examiner

SYSTEMS AND METHODS FOR MEASURING NUCLEAR MAGNETIC RESONANCE SPIN-LATTICE RELAXATION TIME $T_1$ AND SPIN-SPIN RELAXATION TIME $T_2$

CROSS-REFERENCE OF RELATED APPLICATION

This application claims priority to U.S. Provisional Application No. 61/566,265 filed Dec. 2, 2011, the entire content of which is hereby incorporated by reference.

This invention was made with Government support of Grant No. ROI EB 007829, awarded by the Department of Health and Human Services, The National Institutes of Health (NIH). The U.S. Government has certain rights in this invention.

BACKGROUND

1. Field of Invention

The field of the currently claimed embodiments of this invention relates to nuclear magnetic resonance systems and methods, and more particularly to systems and methods for measuring nuclear magnetic resonance spin-lattice relaxation time $T_1$ and spin-spin relaxation time $T_2$.

2. Discussion of Related Art

The term adiabatic as applied to nuclear magnetic resonance (NMR) excitation pulses refers to frequency and/or amplitude modulated pulses whose effective $B_1$-field in the frame-of-reference rotating at the Larmor frequency change sufficiently slowly such that the nuclear magnetization M is able to follow it without inducing transitions[1, 2]. Adiabatic pulses are highly-valued for their insensitivity to radio frequency (RF) and static magnetic field ($B_0$) inhomogeneity over ranges determined by the pulse duration τ, flip-angle θ, and transverse RF field ($B_1$) amplitude and frequency sweep [3]. The duration of the pulses is supposed to be shorter than any relaxation processes—whence the term, adiabatic fast passage, originally used to describe these pulses.

In the classic experiment, the frequency was swept linearly through resonance [1, 2]. Nowadays, adiabatic full-passage (AFP; θ=180°) and half passage (AHP; θ=90° pulses with $B_1$(t) amplitude/frequency-sweeps that vary as sin/cos, tan/tan h and sech/tan h, offer far superior $B_1$-performance [2-5]. The BIR-4 ($B_1$-insensitive rotation) pulse, which combines four AHP segments, has further extended adiabaticity to flip-angles that can be arbitrarily pre-set anywhere in the range |θ|≤180° [6]. The BIR-4 flip-angle is set by means of two phase-jumps between the segments, which can be phase-cycled to improve accuracy [7].

All of these pulses, and especially the BIR-4 pulses, are intrinsically longer than conventional hard pulses. To the extent that the magnetization M evolves in the transverse plane during the pulse, it is subject to transverse $T_2$ (spin-spin) relaxation decay, even when the pulses are self-refocusing [3, 8, 9]. This dependence is potentially exploitable for measuring $T_2$, or for enhancing $T_2$ contrast. To date, except for the use of spectral linewidths, $T_2$ has been measured with NMR spin-echoes (SEs). The most accurate $T_2$ measurements are derived from the Carr-Purcell-Meiboom-Gill (CPMG) technique [10]. SEs are routinely used to provide critically important $T_2$-dependent contrast and $T_2$ measurements in clinical diagnostic magnetic resonance imaging (MRI) [11].

Conventional MRI of relaxation times is done using the partial saturation (PS) or inversion recovery (IR) methods for $T_1$, and the SE method for $T_2$. In addition, $B_1$ field mapping is often required to correct for inhomogeneity in the RF magnetic field, $B_1$. Also, differences in $T_2$ provide an important contrast mechanism in MRI. $T_2$ is conventionally measured by the spin-echo (SE) method in NMR, which is combined with spatial localization for MRI to obtain $T_2$ images and/or images with $T_2$-enhanced contrast or "$T_2$-weighting". All of these measurements require multiple acquisitions. Therefore, there remains a need for improved NMR systems and methods.

SUMMARY

A system for measuring nuclear magnetic resonance spin-lattice relaxation time $T_1$ and spin-spin relaxation time $T_2$ of a sample according to some embodiments of the current invention includes a source of a substantially uniform magnetic field $B_0$ for immersing at least a portion of the sample; a nuclear magnetic resonance excitation and detection system constructed and arranged to excite at least a portion of the sample with a plurality of nuclear magnetic resonance pulse sequences, each applied with a repetition time that is preselected to be sensitive to a $T_1$ value of at least a portion of the sample, and to detect nuclear magnetic resonance emissions from the sample in response to excitations to provide a plurality of detection signals; and a signal processing system configured to communicate with the nuclear magnetic resonance excitation and detection system to receive the plurality of detection signals. The signal processing system is configured to process the plurality of detection signals to determine measured values for both $T_1$ and $T_2$ for the sample. The plurality of nuclear magnetic resonance pulse sequences includes at least a first pulse sequence that includes a non-adiabatic excitation pulse, a second pulse sequence that includes at least a first adiabatic pulse having a duration $\tau_2$, and a third pulse sequence that includes a second adiabatic pulse having a duration $\tau_3$ chosen to be sensitive to a $T_2$ value of at least a portion of the sample. Each of the non-adiabatic pulses has a duration that is shorter than $\tau_2$, $\tau_3$ and $T_2$.

A method of measuring nuclear magnetic resonance spin-lattice relaxation time $T_1$ and spin-spin relaxation time $T_2$ of a sample according to some embodiments of the current invention includes immersing the sample in a substantially uniform magnetic field $B_0$; exciting at least a portion of the sample with a plurality of nuclear magnetic resonance pulse sequences, each applied with a repetition time that is preselected to be sensitive to a $T_1$ value of at least a portion of said sample; detecting nuclear magnetic resonance emissions from the sample in response to the exciting to provide a plurality of detection signals; and processing the detection signals to determine measured values for both $T_1$ and $T_2$ for the sample. The plurality of nuclear magnetic resonance pulse sequences includes at least a first pulse sequence that includes a non-adiabatic excitation pulse, a second pulse sequence that includes at least a first adiabatic pulse having a duration $\tau_2$, and a third pulse sequence that includes a second adiabatic pulse having a duration $\tau_3$ chosen to be sensitive to a $T_2$ value of at least a portion of the sample. Each of the non-adiabatic pulses has a duration that is shorter than $\tau_2$, $\tau_3$ and $T_2$.

A method of measuring nuclear magnetic resonance spin-lattice relaxation time $T_1$ and spin-spin relaxation time $T_2$ of a sample with improved correction for nonuniformity in a $B_1$ magnetic field component according to some embodiments of the current invention includes immersing the sample in a substantially uniform magnetic field $B_0$; exciting at least a portion of the sample with a plurality of nuclear magnetic resonance pulse sequences, each applied with a repetition period that is preselected to be sensitive to a $T_1$ value of at least a portion of the sample; detecting nuclear magnetic resonance emissions from the sample in response to the plurality of nuclear magnetic resonance pulse sequences to provide a plurality of detection signals; and processing the detection signals to determine measured values for both $T_1$ and $T_2$ for the sample. The plurality of nuclear magnetic resonance pulse sequences includes at least first, second, third and fourth pulse sequences, wherein each of the first, second, third and fourth pulse sequences include at least one excitation pulse with excitation angles $\theta_1$, $\theta_2$, $\theta_3$, $\theta_4$, respectively. At least one of the first, second, third and fourth pulse sequences includes an adiabatic pulse having a duration $\tau_1$ chosen to be sensitive to a $T_2$ value of at least a portion of the sample. $B_1$ is a magnetic field component provided by the plurality of nuclear magnetic resonance pulse sequences.

A system for measuring nuclear magnetic resonance spin-lattice relaxation time $T_1$ and spin-spin relaxation time $T_2$ of a sample with improved correction for nonuniformity in a $B_1$ magnetic field component according to some embodiments of the current invention includes a source of a substantially uniform magnetic field $B_0$ for immersing at least a portion of the sample; a nuclear magnetic resonance excitation and detection system constructed and arranged to excite at least a portion of the sample with a plurality of nuclear magnetic resonance pulse sequences, each applied with a repetition period that is preselected to be sensitive to a $T_1$ value of at least a portion of the sample, and to detect nuclear magnetic resonance emissions from the sample in response to excitations to provide a plurality of detection signals; and a signal processing system configured to communicate with the nuclear magnetic resonance excitation and detection system to receive the plurality of detection signals. The signal processing system is configured to process the plurality of detection signals to determine measured values for both $T_1$ and $T_2$ for the sample. The plurality of nuclear magnetic resonance pulse sequences includes at least first, second, third and fourth pulse sequences, wherein each of the first, second, third and fourth pulse sequences include at least one excitation pulse with excitation angles $\theta_1$, $\theta_2$, $\theta_3$, $\theta_4$, respectively. At least one of the first, second, third and fourth pulse sequences includes an adiabatic pulse having a duration $\tau_1$ chosen to be sensitive to a $T_2$ value of at least a portion of the sample. $B_1$ is a magnetic field component provided by the plurality of nuclear magnetic resonance pulse sequences.

BRIEF DESCRIPTION OF THE DRAWINGS

Further objectives and advantages will become apparent from a consideration of the description, drawings, and examples.

FIG. 13A Tri-τ $T_1$ and $T_2$ error with TR=0.609 s, $τ_3$=2$τ_2$=20 ms, $B_1$=13.5 uT; FIG. 13B Dual-τ dual-TR $T_1$ and $T_2$ error with TR2=2TR1=1.06 s, τ2=2τ1=20 ms, $B_1$=20 uT; FIG. 13C Tri-FA $T_1$ and $T_2$ error with TR=0.6 s, TR4=1.032 s, τ=20 ms, $B_1$=20 uT.

DETAILED DESCRIPTION

Figure 1:
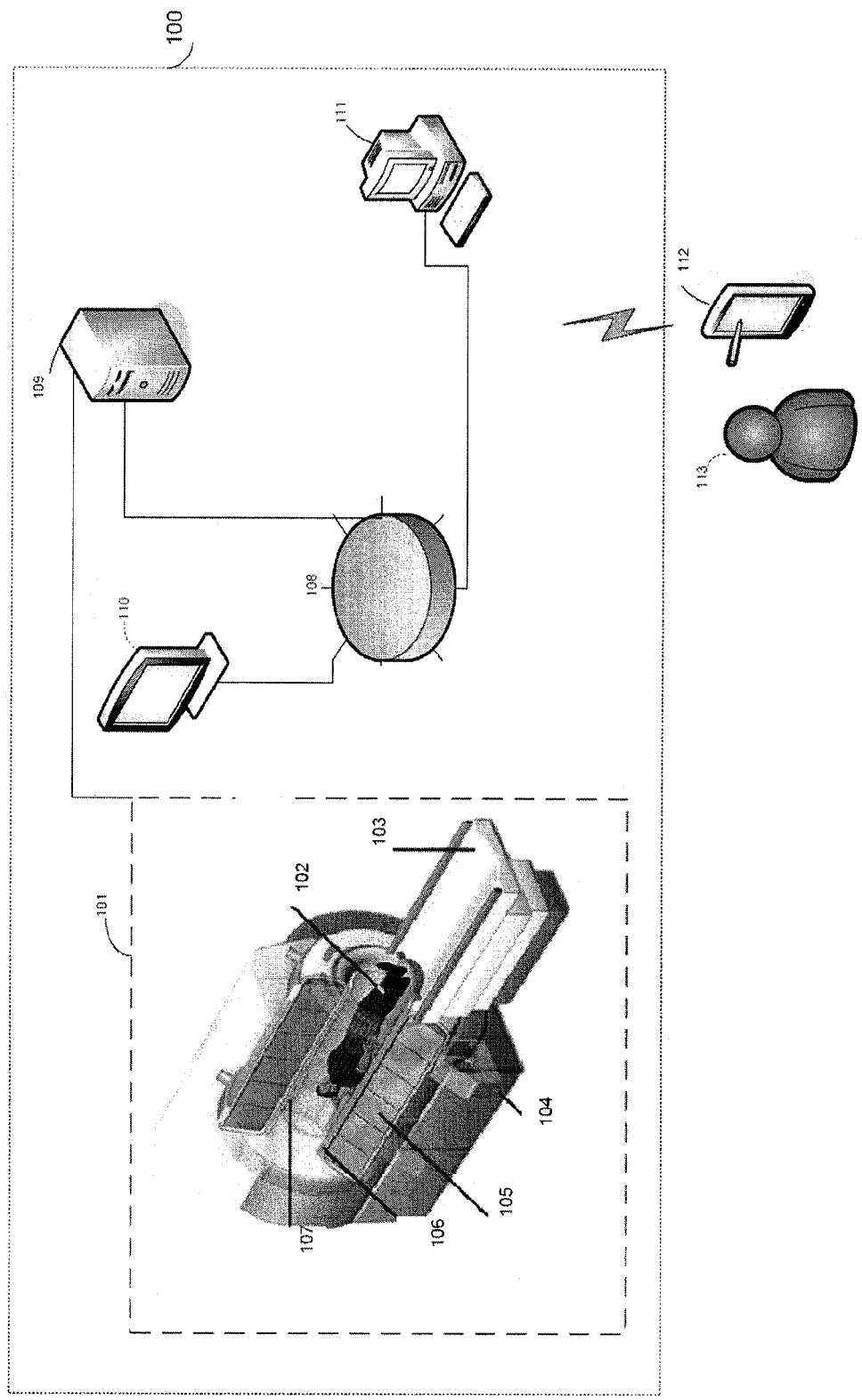
FIG. 1 is a schematic illustration of a system for measuring NMR spin-lattice relaxation time $T_1$ and spin-spin relaxation time $T_2$ of a sample according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Some embodiments of the current invention provide three modes of implementation, which are termed Tri-τ, Dual-τ/dual-TR, and Tri-FA, and which employ the least possible number of acquisitions for providing the described measurements. Three acquisitions are used for measuring and imaging the nuclear (or proton) spin density (denoted $M_0$, or PD), $T_1$ and $T_2$, while four acquisitions are used for measuring $M_0$, $T_1$, $T_2$, and $B_1$. All embodiments measure $T_2$ without spin echoes, based on the $T_2$ attenuation effect imparted by the application of long-duration adiabatic pulses [1]. $T_2$ contrast can also be imparted in images by adding a 0° non-selective adiabatic prepulse (a BIR-4 pulse in this case) to a spatially-selective imaging sequence. The $T_1$ information can be measured by either varying the flip angles (FA) [2] according to the Tri-τ embodiment described herein, or by varying the repetition time (TR), in accordance with the Dual-τ/dual-TR embodiment. The third, Tri-FA embodiment determines $T_1$, $B_1$, and $M_0$ by varying flip angles (FAs) in three spoiled gradient recalled echo (SPGR) acquisitions, followed by a fourth acquisition in which the signal is attenuated by $T_2$ after application of an adiabatic pre-pulse.

The in vitro validation of all three methods according to some embodiments of the current invention is compared herein with standard measurements. In addition, in vivo results from the human brain are obtained for the Tri-τ method according to an embodiment of the current invention.

According to an embodiment of the current invention, we present a new approach for measuring $T_2$ in NMR and MRI, and for providing $T_2$ contrast in MRI, that does not use SEs. Instead, the $T_2$ dependence of adiabatic pulses is harnessed to measure $T_2$ by repeating the NMR or MRI acquisition sequence using one or more different adiabatic pulse lengths τ. This is analogous to the "dual-τ" method, for providing a $T_2$ measurement from the ratio of NMR signals acquired with short- and long-duration adiabatic pulses, and there is a dual-angle method for measuring the $T_1$ (spin-lattice) relaxation time from the ratio of signals acquired with two BIR-4 pulse flip-angles. In particular, by means of addition of a third acquisition, the measurement of both $T_2$ and $T_1$ is possible by using a combination of different pulse lengths and FAs in accordance with Tri-τ, Dual-r/dual-TR, and Tri-FA embodiments of the current invention. The present embodiments have been reduced-to-practice with self-refocusing BIR-4 pulses and validated by Bloch equation simulations and by experimental studies of phantoms whose $T_2$ s and $T_1$ s are measured by standard CPMG SE and partial saturation (PS) methods, respectively. The simulations provide a look-up table or curve which is used to convert measured signal ratios into $T_2$ values. $T_1$ is determined from a formula analogous to that used for the dual-angle method [12].

Because adiabatic pulses are generally unsuitable for spatially-selective excitation in MRI, their use in imaging in accordance with embodiments of the present invention is most easily accomplished by addition of a 0° BIR-4 pre-pulse to a conventional MRI sequence. Since a 0° pulse does not otherwise affect the nuclear spin dynamics, other desirable MRI contrast and functional properties built into the sequence that follows the pre-pulse, can be preserved. For example, a single 0° BIR-4 pre-pulse of length τ can provide $T_2$-contrast or $T_2$-weighted MRI, as well as "$T_2$-prep" ($T_2$-preparation) MRI with a lower $B_1$ threshold than $T_2$-prep sequences employing AHP and AFP pulses [13]. Quantitative Dual-τ $T_2$ imaging has been performed by applying MRI sequences with and without the 0° τ pre-pulse, and validated in MRI studies of phantoms and the human foot by comparison with standard multi-SE methods.

The following theory helps explain some concepts of the current invention. However, the broad concepts of the current invention are not limited to the theory.

Theory

To provide an understanding of the present invention, we first consider the NMR properties of the dual-τ method of measuring $T_2$. The longitudinal (A) and transverse ($M_{xy}$) magnetization of the NMR signal are affected by both $T_1$ and $T_2$ relaxation following a long adiabatic pulse [9]. At the end of an adiabatic pulse with flip angle θ (time $0^+$), $M_z(0^+)$=cos θ·$M_z(0^-)$·$E_p^z$ and $M_{xy}(0^+)$=sin θ·$M_{xy}(0^-)$·$E_p^{xy}$, as compared to the start of the pulse (time $0^-$). Here $E_p^z$ and $E_p^{xy}$ are longitudinal and transverse attenuation factors, which are functions of τ, $T_2$, $B_1$ and the maximum frequency sweep, $f_{max}$, of the pulse, but not $T_1$ as long as τ<<$T_1$. After self-refocusing at the end of the adiabatic pulse, the $T_2$ decay can be written as $E_p^{xy}=e^{-g\tau/T_2}$, where g is a parameter reflecting the fraction of time spent by the magnetization in the transverse plane during the pulse. Numerical analysis of the Bloch equations for $T_2$≤200 ms with BIR-4 pulses of duration τ<40 ms (see methods, below) shows that $E_p^z = E_p^{xy}$. We thus denote $E_p = E_p^z = E_p^{xy}$.

If the residual transverse magnetization prior to time $0^-$ is crushed [14], the steady-state magnetization after a sequence of adiabatic pulses applied at a repetition period TR comparable to $T_1$ is [9]:

$$M_z^\infty(0^+) = M_0 \frac{(1-E_1) \cdot \cos\theta \cdot E_p}{1 - \cos\theta \cdot E_p \cdot E_1};\quad (1)$$

$$M_{xy}^\infty(0^+) = M_0 \frac{(1-E_1) \cdot \sin\theta \cdot E_p}{1 - \cos\theta \cdot E_p \cdot E_1},$$

where $E_1 = e^{-TR/T_1}$ and $M_0$ is the equilibrium nuclear magnetization. If $\theta = 90°$, the application of two such sequences with the same TR but two different pulse durations $\tau_1$ and $\tau_2$, will produce steady-state signals $$M_{xy}(\tau=\tau_1) = M_0(1-E_1)E_{p1}$$

and $$M_{xy}(\tau=\tau_2) = M_0(1-E_1)E_{p2}.$$

The ratio of these signals is:

$$R = \frac{M_{xy}(\tau=\tau_1)}{M_{xy}(\tau=\tau_2)} = \frac{M_0(1-E_1)E_{p1}}{M_0(1-E_1)E_{p2}} = \frac{E_{p1}}{E_{p2}} \quad (2)$$

where $E_{p1}$ and $E_{p2}$ are the attenuation factors for the two pulses. Thus, R is just a function of $T_2$ which can be derived numerically from the known $B_1$ and $f_{max}$.

Tri-τ $T_2$ and $T_1$ Measurements

The Dual-τ method is limited by the choice of $\theta = 90°$ required to cancel the coefficient of $E_p$ in the denominator of Eq. (1) for short TR. Incomplete cancellation can occur due to pulse imperfections, incomplete dephasing of residual transverse magnetization, and/or deviations in $E_p$ as TR approaches $T_2$. Achieving perfect 90° pulses is often problematic for in vivo applications such as MRI where the pulses are slice-selective and the RF fields are seldom uniform across the slice. While increasing TR can alleviate this problem, long TRs generally reduce the SNR per unit time and increase the scan time. We have overcome these limitations by adding a third acquisition to accommodate both θ<90° pulses and short TRs. Importantly, the additional acquisition can permit a simultaneous determination of $T_1$ and $T_2$.

We call this the Tri-τ method, in which: 1) a first signal $S_1$ is acquired with a conventional short α RF excitation pulse without adiabatic excitation; 2) a second signal $S_2$ is excited by a β° adiabatic pulse of duration $\tau_2$; and 3) a third signal $S_3$ is excited by a β adiabatic of length $\tau_3 = 2\tau_2$. The three steady-state signals are:

$$S_1 = \frac{(1-E_1)\sin\alpha}{(1-E_1 \cdot \cos\alpha)} M_0, \quad (3)$$

$$S_2 = \frac{(1-E_1)E_{p2}\sin\beta}{(1-E_1E_{p2}\cos\beta)} M_0 \text{ and}$$

$$S_3 = \frac{(1-E_1)E_{p3}\sin\beta}{(1-E_1E_{p3}\cos\beta)} M_0.$$

Using the same $B_1$ and $f_{max}$ for both adiabatic pulses yields $E_p = e^{-g \cdot \tau/T_2}$, $E_{p3} = E_{p2}^2$, and the equation set simplifies to a quadratic:

$$aE_{p2}^2 + bE_{p2} + c = 0, \quad (4)$$

where $a = S_1 \sin\beta \cos\beta \sin\alpha(S_3 - S_2)$, $b = S_1S_2 \sin^2\alpha \cos\alpha \sin\beta - S_2S_3 \sin^2\alpha \cos\beta$, and $c = S_2S_3 \sin^2\alpha \cos\beta - S_1S_3 \sin\alpha \cos\alpha \sin\beta$.

Choosing the root of Eq. (4) that falls in the interval (0, 1) yields the $T_2$ attenuation factor $$E_{p2} = \frac{-b \pm \sqrt{b^2 - 4ac}}{2a}. \quad (5)$$

Substitution of Eq. (5) into Eq. (3) yields the $T_1$ attenuation factor $$E_1 = \frac{S_2 \sin\alpha - S_1 \sin\beta E_{p2}}{(S_2\sin\alpha \cos\beta - S_1\cos\alpha \sin\beta)E_{p2}} \quad (6)$$

or $$E_1 = \frac{S_3 \sin\alpha - S_1 \sin\beta E_{p3}}{(S_3\sin\alpha \cos\beta - S_1\cos\alpha \sin\beta)E_{p3}}.$$

This is basically the dual-angle equation [12] with an $E_{p2}$-attenuation correction. Thus, from $E_{p2}$ and $E_1$, $$T_2 = \frac{g \cdot \tau_2}{\ln(E_{p2})} \quad (7)$$

and $$T_1 = -\frac{TR}{\ln(E_1)}.$$

FIG. 1 is a schematic illustration of a system 100 for measuring NMR spin-lattice relaxation time $T_1$ and spin-spin relaxation time $T_2$ of a sample according to an embodiment of the current invention. The system 100 can include, but is not limited to, a magnetic resonance scanner 101. The magnetic resonance scanner 101 can accommodate a subject 102 under observation on scanner bed 103, for example. The base 104 supports a source 205 of a substantially uniform magnetic field $B_0$ for immersing at least a portion of the sample (e.g., subject 102). In some embodiments, the magnetic resonance scanner 101 can include a gradient magnetic field system 106 constructed and arranged to apply at least one gradient magnetic field to provide spatial information, such as a perturbation of the magnetic field $B_0$ to encode spatial information of the constituent water molecules of subject 102 under observation. The magnetic resonance scanner 101 further has a NMR excitation and detection system 107 constructed and arranged to excite at least a portion of the sample with a plurality of NMR pulse sequences, each applied with a repetition time, TR, that is preselected to be sensitive to a $T_1$ value of at least a portion of the sample, and to detect NMR emissions from the sample in response to excitations to provide a plurality of detection signals. In some embodiments, the system 100 can include a data storage unit 108. The NMR excitation and detection system 107 can include a radio-frequency (RF) coil system 107 to transmit electromagnetic (EM) waves that includes a transverse RF magnetic field, $B_1$, and to receive magnetic resonance signals from subject 102, for example.

The system 100 also has a signal processing system 109 configured to communicate with the NMR excitation and detection system to receive the plurality of detection signals. Signal processing system 109 can be partially or totally incorporated within a structure 104 housing magnetic resonance scanner 101 and/or partially or totally incorporated in a workstation that is structurally separate from and in communication with magnetic resonance scanner 101.

Data storage unit 108 can be, for example, a hard disk drive, a network area storage (NAS) device, a redundant array of independent disks (RAID), a flash drive, an optical disk, a magnetic tape, a magneto-optical disk, etc. However, the data storage unit 108 is not limited to these particular examples. It can include other existing or future developed data storage devices without departing from the scope of the current invention.

The signal processing system 109 can also be configured to communicate with data storage unit 108. In some embodiments, results can be displayed on a viewing station 110 or a console station 111, for example. In some embodiments, an operator 113 may use an input/output device 112 to interact, control and/or receive results from system 100.

The signal processing system 109 is configured to process the plurality of detection signals to determine measured values for both $T_1$ and $T_2$ for the sample. The plurality of NMR pulse sequences include at least first, second, and third pulse sequences, at least one of which also includes an adiabatic pulse of duration chosen to be sensitive to a $T_2$ value of at least a portion of the sample. In one embodiment, the plurality of pulse sequences include at least a first pulse sequence that includes a non-adiabatic excitation pulse, a second pulse sequence that includes at least a first adiabatic pulse having a duration $\tau_2$, and a third pulse sequence that includes a second adiabatic pulse having a duration $\tau_3$ chosen to be sensitive to a $T_2$ value of at least a portion of the sample. Each of the non-adiabatic pulses has a duration that is shorter than $\tau_2$, $\tau_3$ and $T_2$.

In some embodiments, $\tau_3$ is substantially twice as long as $\tau_2$. In some embodiments, the non-adiabatic pulse in the first pulse sequence provides an excitation angle α, and both the first and second adiabatic pulses provide an excitation angle β. In some embodiments, at least one of the adiabatic pulses is a $B_1$-independent rotation pulse (BIR-4), wherein $B_1$ is a magnetic field component provided by the NMR pulse sequences. In some embodiments, at least one of the first and second adiabatic pulses is a 0° adiabatic pulse, and the at least one 0° adiabatic pulse is followed by at least one non-adiabatic pulse providing an excitation angle β. In yet other embodiments, the plurality of pulse sequences includes at least a fourth pulse sequence that includes an adiabatic pulse having a duration $\tau_1$ chosen to be sensitive to a $T_2$ value of at least a portion of the sample, and first, second, third and fourth pulse sequences provide excitation angles of excitation angles $\theta_1$, $\theta_2$, $\theta_3$, $\theta_4$, respectively.

In some embodiments, the gradient magnetic field system 106 can apply at least one gradient magnetic field to provide spatial information and the signal processing system 109 is further configured to process the detection signal using the spatial information to construct an image of at least a portion of the sample. This can provide an MRI system in some embodiments.

In some embodiments, the plurality of NMR pulse sequences is applied with at least two different repetition periods. In some embodiments, the first pulse sequence and the third pulse sequence are applied with a first repetition period TR1, and the second pulse sequence is applied with a second repetition period TR2 that is substantially twice as long as TR1. In some embodiments, the first pulse sequence also includes an adiabatic pulse of duration $\tau_1$. In further embodiments, $\tau_1$ is substantially equal to $\tau_2$, and $\tau_3$ is substantially twice as long as $\tau_2$. In further embodiments, at least one of the adiabatic pulses is a 0° adiabatic pulse, and the at least one 0° adiabatic pulse is followed by at least one non-adiabatic pulse providing an excitation angle α. In further embodiments, all adiabatic pulses in the first, second and third pulse sequences are 0° adiabatic pulses followed by non-adiabatic pulses with the same excitation angle α. In some embodiments, the adiabatic pulses have respective duration values in a range of 3 ms to 60 ms.

Some embodiments of the current invention are summarized in the following table:

|  | # sequences | S1 | S2 | S3 | S4 |
|---|---|---|---|---|---|
| 1st embodiment: Tri-tau method | 3 |  |  |  |  |
| Basic method (non-MRI) | 3 |  |  |  |  |
| adiabatic, FA# |  | none | FA = b° | FA = b° |  |
| adiabatic pulse length, T |  |  | T = t2 | T = t3 = 2*t2 |  |
| non-adiabatic, flip angle (FA)# |  | FA = α° |  |  |  |
| Sequence TR (~T1) |  | TR = TR1 | TR = TR1 | TR = TR1 |  |
| Tri-tau MRI method | 3 |  |  |  |  |
| adiabatic pre-pulse FA |  |  | FA = 0° | FA = 0° |  |
| adiabatic pre-pulse length, T |  |  | T = t2 | T = t3 = 2*t2 |  |
| non-adiabatic FA*# |  | FA = a° | FA = b° | FA = b° |  |
| Sequence TR (~T1) |  | TR = TR1 | TR = TR1 | TR = TR1 |  |
| 2nd embodiment: Dual-TR/Dual-tau method | 3 |  |  |  |  |
| Basic Dual-TR/Dual-tau method (non-MRI) | 3 |  |  |  |  |
| adiabaticpulse FA# |  | FA = a° | FA = a° | FA = a° |  |
| adiabatic pulse length, T |  | T = t1 | T = t1 | T = t2 = 2*t1 |  |
| Sequence TR |  | TR = TR1 (short) | TR = 2*TR1 | TR = TR1 |  |
| Dual-TR/Dual-tau MRI method | 3 |  |  |  |  |
| adiabatic pre-pulse FA |  | FA = 0° | FA = 0° | FA = 0° |  |
| adiabatic pre-pulse length, T |  | T = t1 | T = t1 | T = t2 = 2*t1 |  |
| non-adiabatic FA*# |  | FA = a° | FA = a° | FA = a° |  |
| Sequence TR |  | TR = TR1 (short) | TR = 2*TR1 | TR = TR1 |  |
| 3rd embodiment: Tri-FA method | 4 |  |  |  |  |
| Basic Tri-FA method |  |  |  |  |  |
| adiabatic pulse FA |  |  |  | FA = 0° | FA = d° |

-continued

| | # sequences | S1 | S2 | S3 | S4 |
|---|---|---|---|---|---|
| adiabatic pulse length, T | | | | T = t3 = 2*t2 | T = t1 |
| non-adiabatic FA§ | | FA = a° | FA = b° | FA = c° | |
| Sequence TR (~T1) | | TR = TR1 | TR = TR1 | TR = TR1 | TR = TR4 |
| Tri-FA MRI method | 4 | | | | |
| adiabatic FA | | | | FA = 0° | FA = 0° |
| adiabatic pre-pulse length, T | | | | T = t3 = 2*t2 | T = t1 |
| non-adiabatic FA* | | FA = a° | FA = b° | FA = c° | FA = d° |
| Sequence TR (~T1) | | TR = TR1 | TR = TR1 | TR = TR1 | TR = TR4 |

Notes: SA1, SA2, SA3, SA4 all measured at steady-state. Symbols t1, t2, t3 correspond to Greek symbols tau1, tau2, and tau3 in the text and equations.
*flip-angle of 1st pulse in MRI sequence
Note that FAs of a and b correspond to Greek symbols alpha and beta in Equations 5, 8, 10 and 11.
§Note that FAs of a, b, c, and d are denoted by and correspond to Greek symbols theta1, theta2, theta3, and theta4 in Equation 13, etc.

Examples 1

The following presents examples according to some embodiments of the current invention. The broad concepts of the current invention are not limited to the particular examples, which facilitate an explanation of some concepts and applications of embodiments of the current invention.

Material and Methods

Numerical Simulations

Simulations of the Bloch equations were performed using Matlab (Mathworks, Natick, Mass.)[15]. The evolution of magnetization was simulated for proton ($^1$H) relaxation at 3T over the range $20 \leq T_2 \leq 200$ ms and $0.1 \leq T_1 \leq 1$ s for BIR-4 pulses with $B_1=20$ μT and $f_{max}=15$ kHz, as used in experiments. Pulses were defined at 5 μs intervals with lengths varying from $1 \leq \tau \leq 40$ ms, a practical range given limitations in RF pulse power and power deposition. Adiabatic pulse flip-angles were varied from $0 \leq \theta \leq 90°$. The simulations were used to derive the attenuation factors, $E_p^z$ and $E_p^{xy}$ after long BIR-4 pulses, decay parameter g, and the corresponding signal ratio R, as a function of $T_2$, $T_1$, τ, and θ in the Dual-τ experiment.

Monte Carlo simulations were performed to evaluate the sensitivity of Dual-τ and Tri-τ measurements, to noise. The SD of the noise was set at 2% of the signal strength (SNR=50) elicited by each pulse. The signals, their ratio R for the Dual-τ $T_2$ experiment, and the solutions to Eq. 7 for the Tri-τ experiment, were determined for 1000 simulations as a function of $T_2$ up to 80 ms in the Dual-τ and Tri-τ experiments, and $0.1 \leq T_1 \leq 1$ s for the Tri-τ experiment. Note that $T_2$ measured by the Dual-τ experiment is unaffected by TR for perfect FA=θ=90° pulses.

Phantom Preparation

Twelve phantoms with tissue-comparable relaxation times were prepared with agarose (Type 1-A CAS 9012-36-3: Sigma Chemical, St. Louis, Mo., USA) and $CuSO_4$ (CAS 7758-99-8: Acros organics, Geel, Belgium) in de-ionized distilled water. Both agarose and $CuSO_4$ shorten the $T_1$ and $T_2$ of pure water. However, agarose decreases $T_2$ more effectively than $CuSO_4$, which more strongly affects $T_1$. The concentrations of $CuSO_4$ and agarose were adjusted from 0.2 to 1.6 g/l and 10 to 110 g/l respectively, to provide phantoms with 10 ms<$T_2$<130 ms, and 0.15 s<$T_1$<1.0 s [16].

The ingredients were mixed in a beaker and heated in a microwave oven to dissolve the agarose without introducing too many bubbles.

The hot solutions were then sealed to occupy 9 cm of 12 cm-long, 25 mm inner diameter (ID) plastic tubes and allowed to cool and gel.

NMR Measurements

All NMR and MRI measurements were done on a 3T Achieva MRI scanner (Philips Healthcare, Best, The Netherlands) using the standard transmit/receive birdcage head coil (maximum $B_1=20$ μT). The gel phantoms were set in a plastic foam panel in the center of the coil with long axes parallel to the z-axis. To facilitate $T_1$ and $T_2$ measurements, NMR data were acquired with one-dimensional chemical shift imaging (1D CSI; 5 mm resolution; acquisitions per frame, NEX=1) from five aligned phantoms at a time. In all measurements involving BIR-4 pulses, the flip angles were calibrated at the pulse lengths being tested. Dual-τ $T_2$ was measured with two 90° BIR-4 pulses of lengths $\tau_1=5$ ms ($f_{max}=12$ kHz) and $\tau_2=35$ ms ($f_{max}=15$ kHz), the shortest TE (1.8 ms) and TR=4 s.

Reference $T_2$ and $T_1$ relaxation times were measured at 3T using standard SE and PS NMR methods, respectively. Individual SE data was obtained using 1D CSI with 8 different echo times (TE=14, 30, 50, 75, 100, 150, 200, 300 ms), and TR set to 4.0 s to allow for complete signal recovery. $T_1$ was measured using PS sequences with TR=0.25, 0.5, 1, and 3 s. Because relaxation times can change slowly over time, these measurements were repeated whenever a dual- or Tri-τ study was done.

CSI yielded approximately 5 slices in the CSI direction from each phantom. The free induction decay (FID) signals acquired from the three middle slices in each phantom were fitted using jMRUI software (available from www.mrui.uab.es)[17] to determine the peak areas. These values were used to determine the signal ratio at the two r values. Dual-τ $T_2$ was then determined from a look-up curve generated by the numerical analysis (see Results mean±SD). Reference $T_1$ and $T_2$ measurements obtained by conventional SE and PS methods were determined from the same three slices by fitting the data sets to $\{w \cdot \exp(-TE/T_2)\}$ and $\{u-v \cdot \exp(-TR/T_1)\}$ with u, v and w constants. Mean reference relaxation times from the phantoms used in the Dual-τ studies are listed in Table 1.

TABLE 1

Numbered phantoms with their relaxation times for the Dual-τ $T_2$
NMR and MRI studies. $T_2$ was measured by a 32-points SE NMR method
(TE stepped by 7.21 ms). $T_1$ was measured by partial saturation NMR
(0.1 s ≤ TR ≤ 1.5 s). The signal within each phantom was first averaged
then fit to an exponential relaxation curve.

| | Phantom No. | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $T_2$(ms) | 110 | 97 | 65 | 65 | 52 | 44 | 35 | 28 | 18 | 13 | 106 | 67 |
| $T_1$(ms) | 818 | 837 | 770 | 740 | 691 | 702 | 665 | 635 | 567 | 582 | 825 | — |

The Tri-τ method was also validated in 1DCSI studies of 12×1.3 cm inner diameter (ID) and 4×2.5 cm ID phantoms with 169≤$T_1$≤890 ms and 31≤$T_2$≤129 ms. We used $τ_3=2τ_2=20$ ms, and TR=300 ms for all experiments. Shorter TRs were limited by RF power restrictions. $S_1$ was acquired with a (non-adiabatic) 74 μs α-hard pulse nominally set to 15°. The flip-angle was 14° for the short phantoms as determined from $B_1$ field profiles measured separately, and 13.5° for the long phantom. The β-pulse used to acquire $S_2$ and $S_3$ was a 60° BIR-4 pulse. The choice of the nominal α=15° and β=60° pair for the Tri-τ experiments was based on the dual-angle $T_1$ method [12].

MRI Measurements

The BIR-4 pulse is unsuited to spatial localization. Thus for MRI applications, either multi-dimensional phase-encoding can be used (with generally unpalatable scan times), or the BIR-4 pulse can be applied in conjunction with an additional spatial localization pulse. We adopt the latter approach by adding a 0° BIR-4 pulse before the slice-selective pulse in a standard gradient-echo (FFE) MRI pulse sequence. This is based on numerical analysis showing that the effect on $E_p$ of the BIR-4 pulse is independent of θ (see results).

Figure 2:
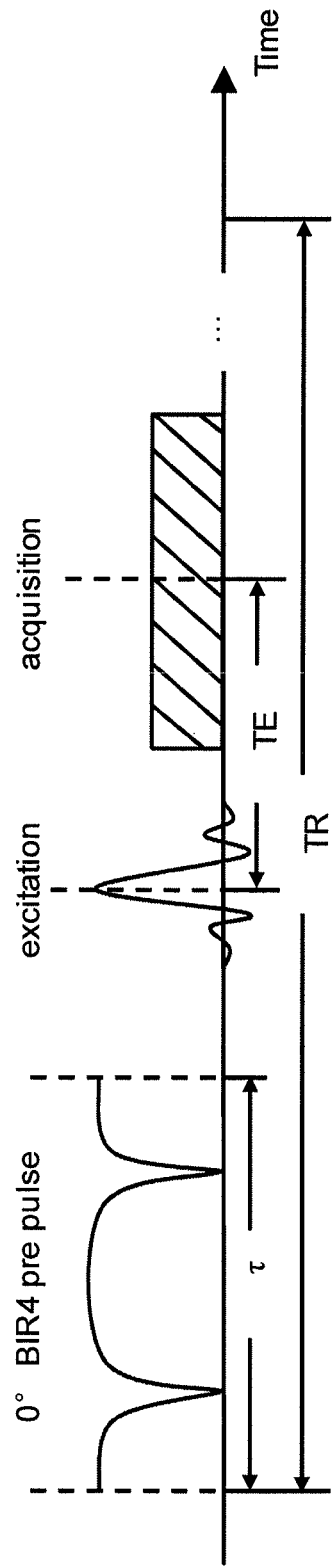
FIG. 2 is a timing diagram of a sequence employing one of a 0° BIR-4 pre-pulse followed by an MRI excitation pulse. In MRI experiments TE is typically set to a minimum (several ms), and the repetition period TR of the whole sequence is typically comparable to a $T_1$ of the sample (eg, 0.15-2 s). The delay between the pre- and excitation-pulses is also kept to a minimum (eg, several ms).

Dual-τ MRI was performed on the phantom set with a two-dimensional (2D) FFE MRI sequence and 0° BIR-4 pulses with the same τ, $f_{max}$ and $B_1$ used in the NMR experiments (acquisition matrix, 152×154; field-of-view, FOV=97×10×230 mm³; slice thickness=10 mm; TR=2 s; minimum TE=2.5 ms). The delay between the BIR-4 and (1 ms) slice-selective pulses was 1.5 ms. Because the excitation pulse and inter-pulse delay are unchanged in this Dual-τ MRI experiment, the same curve from the numerical analysis was used to obtain $T_2$. The sequence timing diagram is shown in FIG. 2. Reference $T_2$ values from conventional MRI were obtained from the phantoms using a three-dimensional (3D) 32-echo sequence (TE step=7.21 ms, TR=461 ms, 2.5 ms excitation pulse 1.5 ms after the BIR-4 pulse). $T_2$ was measured in images by determining the ratio R on a pixel-by-pixel basis for the Dual-τ method, and by fitting the SE pixels to an exponential to obtain reference $T_2$ images. Pixel-average $T_2$ values within each phantom are reported.

Human studies for this project were approved by the Johns Hopkins Institutional Review Board. The foot was chosen based on the expected short $T_2$ s of muscle and cartilage [18], for which analysis showed the Dual-τ method to be well-suited. A healthy volunteer was positioned supine with the foot in the head coil, and Dual-τ $T_2$ MRI performed using two acquisitions of a coronal 3D FFE sequence, one employing a 0° BIR-4 pre-pulse (matrix size, 112×112; slice thickness=6 mm; FOV=42×100×100 mm³, TR=2 s, TE=4.1 ms=minimum). Reference $T_2$ MRI of the foot was performed with the 32-echo sequence (same matrix, slice thickness and FOV as for Dual-τ FFE; TE step=5.39 ms; TR=625 ms). $T_2$ images and average $T_2$ values were calculated the same way as in the phantom studies.

Results

Numerical Analysis

Figure 3:
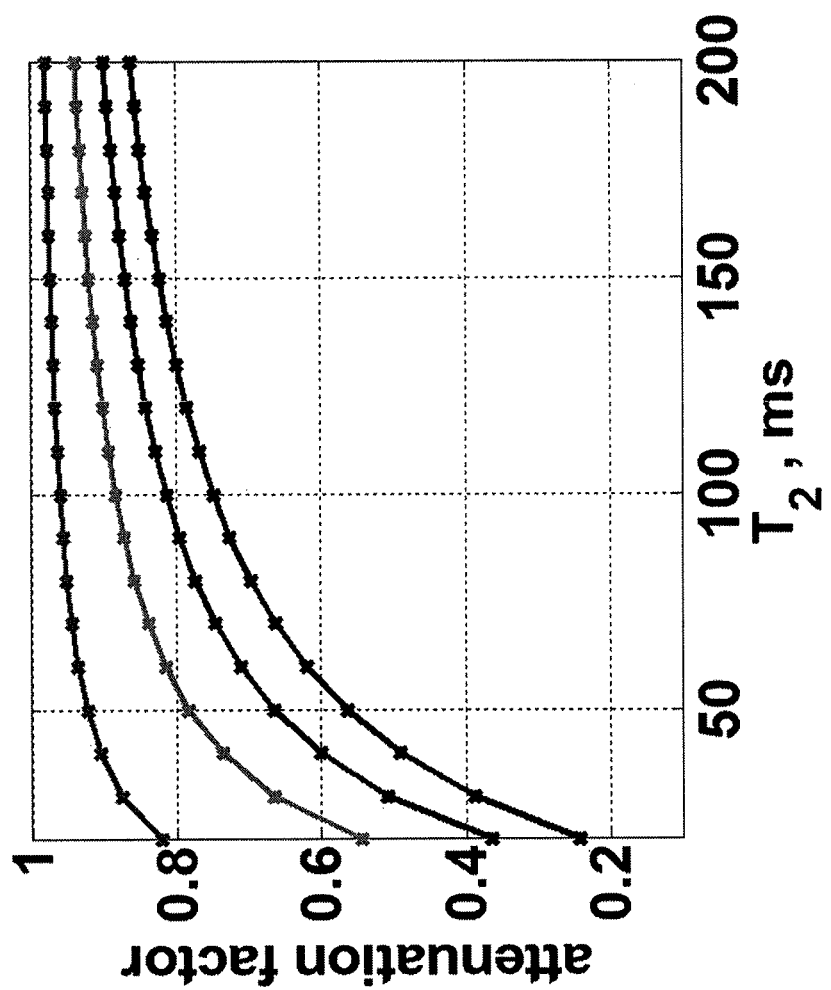
FIG. 3 shows numerical simulations of the attenuation factor $E_p=|M|/M_0$ after a BIR-4 pulse of duration 5 ms (top), 15 ms (second from top), 25 ms (second from bottom) and 35 ms (bottom), as a function of $T_2$ from 20 to 200 ms ($T_1=1$ s, TR=∞ for complete longitudinal relaxation). The curves are exponential fits to points that are numerically determined.

The attenuation factor, $E_p$ as a function of $T_2$ is plotted in FIG. 3 for four BIR-4 pulses of duration 5-35 ms. The curves all fit accurately to the exponential $$E_p(T_2) = \exp\left(-0.81\frac{\tau}{T_2}\right).$$

In this case, g=0.81. This result is independent of FA for 0°≤θ≤90° and for long TR, reflecting the fact that the BIR-4 flip-angle is set by two opposite phase-jumps of duration<<$T_2$ and $T_1$. In the adiabatic region wherein θ is independent of $B_1$, g is relatively insensitive to $f_{max}$, for example, varying by <4% for 12 kHz≤$f_{max}$≤15 kHz and $B_1$=20 μT.

The sensitivity and accuracy of the Dual-τ $T_2$ experiment are improved by selecting BIR-4 pulses with very different pulse lengths, notwithstanding RF power constraints. Pulses shorter than 5 ms have little attenuation but are limited by peak pulse power. Long pulses are limited by the RF power amplifier's ability to sustain the pulse, as well as by the spectral bandwidth of the sample. The ratio of the signals from the $τ_1=5$ ms and $τ_2=35$ ms pulses is plotted in FIG. 4A. The curve is fit by R($T_2$)=exp(−24.3/$T_2$) independent of θ. Sensitivity is maximum over the steepest (short-$T_2$) region of the curve, with the $τ_1/τ_2$=5/35 ms pair providing reasonable $T_2$ resolution up to 70 or 80 ms. Thus, $T_2$ can be read from FIG. 4A using the measured signal ratio. The variation in $T_2$ determined from the ratio curve is plotted as a function of $T_1$ in FIG. 4B. The result varies by <1% for 0.6 s≤$T_1$≤1.0 s, and <6% for 0.2 s≤$T_1$≤1.0 s.

Figures 5A, 5B, 5C, 5D:
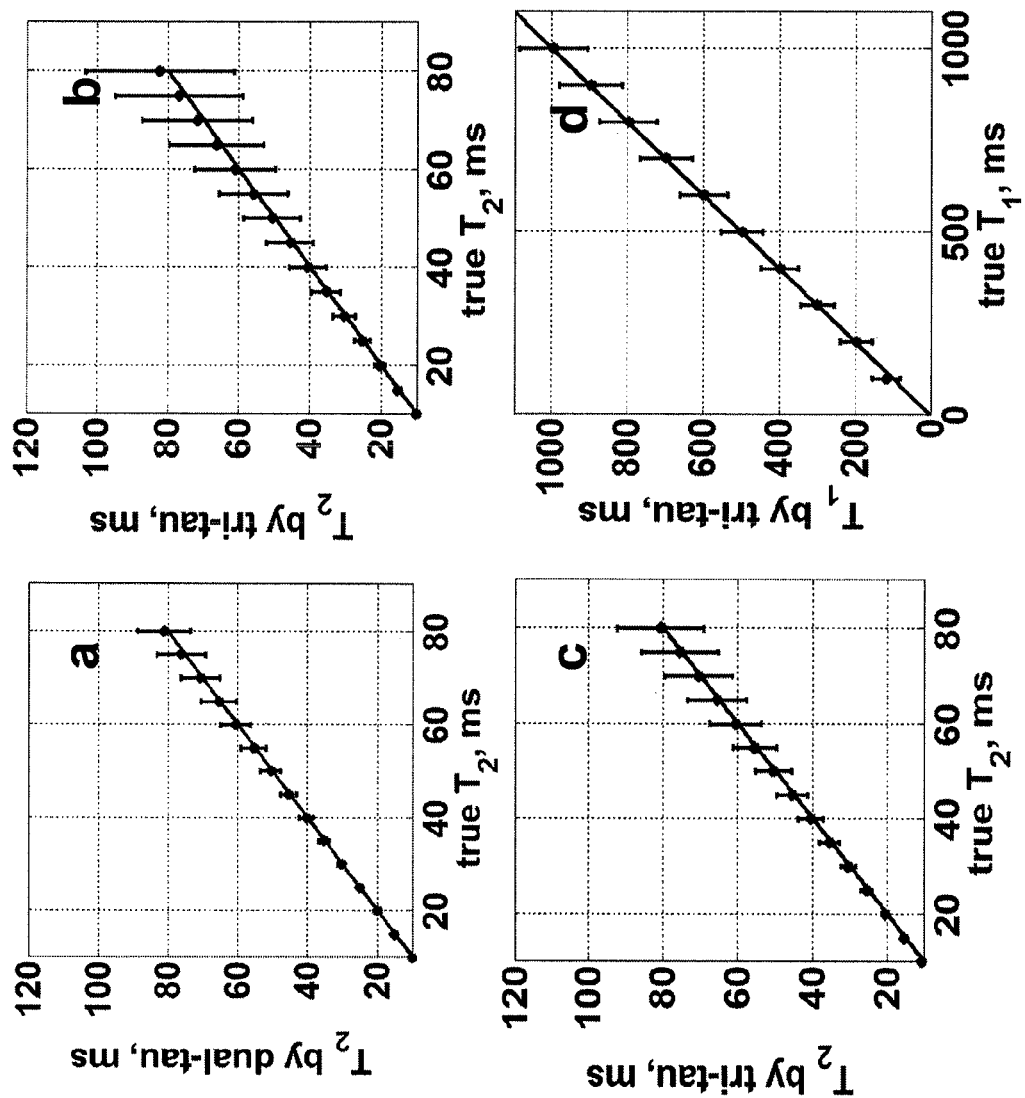
FIGS. 5A-5D show Monte Carlo simulations of the error in (a) Dual-$\tau$ $T_2$ with $\tau_1$=5 ms and $\tau_2$=35 ms; (b) Tri-$\tau$ $T_2$ with $\tau_3=2\tau_2$=20 ms; and (c) with $\tau_3=2\tau_2$=35 ms; and (d) Tri-$\tau$ $T_1$ with $\tau_3=2\tau_2$=20 ms, $T_2$=40 ms, and TR=300 ms. Points are means±SD for a 2% root-mean-square noise in each signal measurement (signal-to-noise ratio, SNR=50) from 1000 runs with $T_1$=1 s. The mean and standard deviation (SD) of the $T_1$ measured by a Tri-$\tau$ experiment with $\tau_3=2\tau_2$=35 ms differs from (d) by less than 1%.

The results of the Monte Carlo simulations are exemplified in FIGS. 5A-5D. For the Dual-τ $T_2$ experiment performed with $τ_1/τ_2$=5/35 ms pulses and signals with 2% SD, the errors are essentially independent of TR for 0.1 s≤TR≤1.0 s. Over this range, the mean error in $T_2$ is less than 6%±9% (SD) of $T_2$ for $T_2$≤80 ms and 0.3 s≤$T_1$≤1 s (FIG. 5A). On the other hand, the simulated Tri-τ experiment with $τ_3=2τ_2=20$ ms is less accurate on average, with a mean error varying from −13% to +6% of $T_2$ (with up to ±30% SD scatter) for $T_2$≤80 ms over the ranges 0.1 s≤TR≤1.0 s and 0.1≤$T_1$≤1 s (FIG. 5B). When $τ_3$ is set to 35 ms—the same as $τ_2$ in the Dual-τ experiment—the mean error decreases to <13%±17% (SD) of $T_2$ for the same $T_1$ s and TRs (eg, FIG. 5C).

The accuracy of $T_1$ in the Monte Carlo simulations of the Tri-τ experiment is better than 1% of $T_1$ with a 9-15% (SD)

scatter, essentially independent of pulse length for $0.3 \leq T_1 \leq 1$ s and $30 \leq T_2 \leq 130$ ms, as shown in FIG. 5D for TR=0.3 s. At shorter $T_1$ s (<TR), the scatter in $T_1$ increases as the long TR becomes sub-optimal for measuring $T_1$ [8]. Then, reducing TR to 0.1 s, reduces the scatter back to 9-15% of $T_1$ for $0.1 \leq T_1 \leq 1.0$ s.

Experiments

Figure 6B:
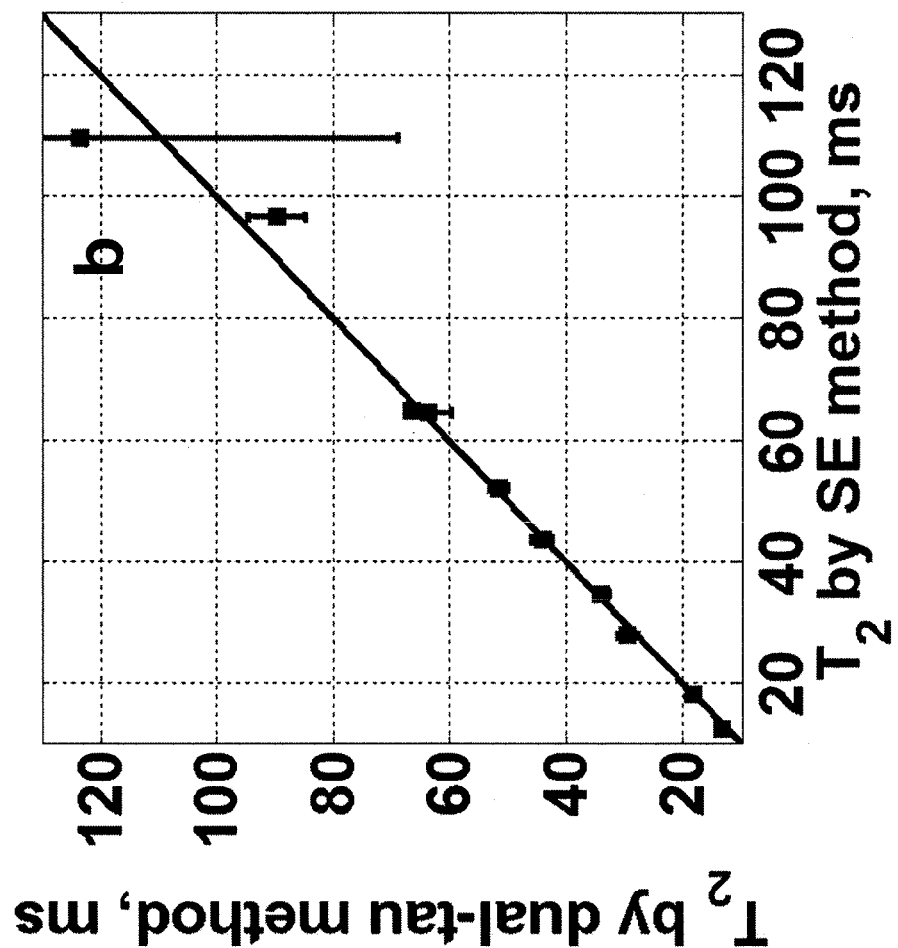
FIG. 6B shows NMR measurements of $T_2$ from the 10 phantoms using Dual-$\tau$ and SE methods. Filled points are the means of the middle three slices of each phantom. Error bars denote±SD.

Results from the $^1$H 1D CSI Dual-τ validation experiments on the 10 phantoms are plotted in FIG. 6B. The $T_1$ of these phantoms was 0.6-0.8 s (Table 1). The $T_2$ s were determined from FIG. 4. Below $T_2$=70 ms, Dual-τ $T_2$ values differ from SE values by ≤3%.

Figures 7A, 7B:
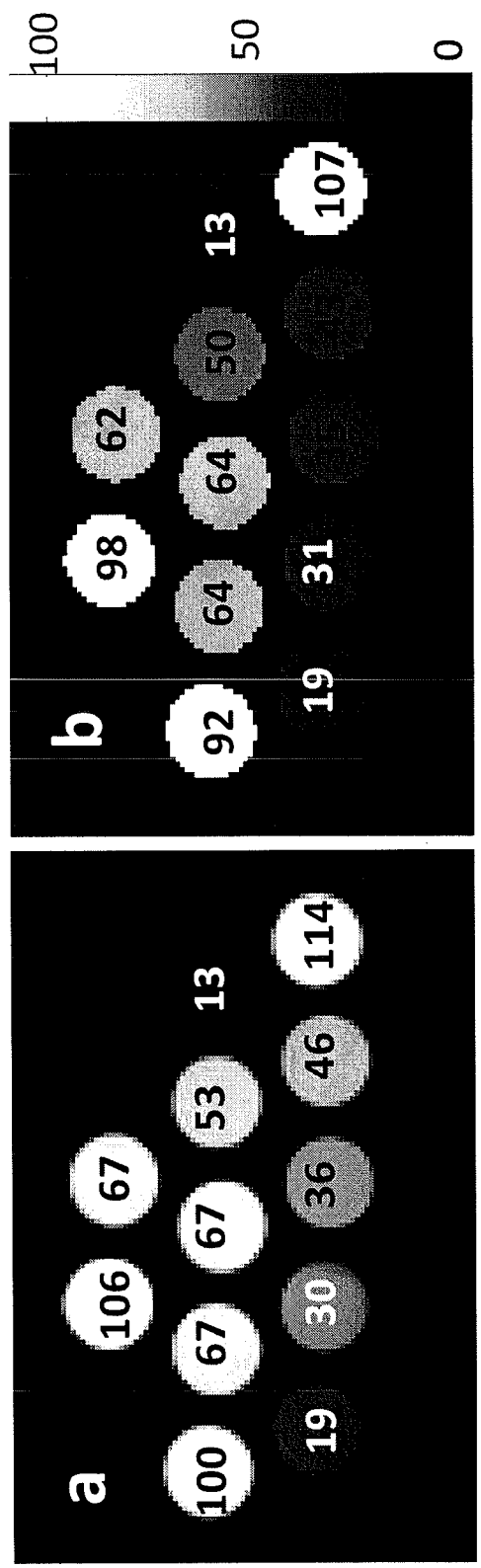
FIG. 7A shows MRI of the phantom set, $T_2$-weighed by a 0° 35 ms BIR-4 pre-pulse. The images are annotated with the corresponding reference SE $T_2$.
FIG. 7B provides color-coded Dual-$\tau$ $T_2$ image with the Dual-$\tau$ $T_2$ values labeled for comparison with part (a). The scale depicts $T_2$ in ms. The $T_2$ map is calculated pixel by pixel, and both images masked at the same threshold (=75% of the lowest signal in part a).
Figures 8A, 8B:
FIGS. 8A and 8B show coronal $T_2$ images of the human foot by the SE method (a) and the Dual-$\tau$ method (b). The scale depicts $T_2$ in ms. Both images are calculated pixel-by-pixel and masked by an identical threshold (SNR=4 in the raw image). Mean $T_2$ s from the annotated squares in (a) vs (b) are: A, 29.8±2.8 ms vs 29.4±1.2 ms; B: 106±4.3 ms vs 135±13 ms; C: 29.8±4.7 ms vs 28.2±1.6 ms; D: 28.8±4.7 ms vs 30.6±1.3 ms.

Dual-τ $T_2$-weighted and $T_2$-image results from the phantoms are shown in FIGS. 7A and 7B. The phantoms are labeled with the corresponding average $T_2$ values measured by standard 32-echo SE MRI (FIG. 7A), and by Dual-τ MRI (FIG. 7B). The $T_2$ values agree with the SE results within 5% up to 70 ms, and 10% up to 100 ms. Dual-τ and standard SE $T_2$ MRI of the foot are compared in FIGS. 8A and 8B. Muscle $T_2$ values from the Dual-τ image are 29.4±1.2 ms, 28.2±1.6 ms, and 30.6±1.3 ms; as compared to 29.8±2.8 ms, 29.8±4.7 ms, and 28.8±4.7 ms in the same annotated volumes in the SE image. These agree with published values for muscle of 32±2 ms at 3T.[18]. In marrow, SE $T_2$ was 106±4.3 ms as compared to Dual-τ $T_2$=135±13 ms in the same volume, and the prior value of 133±6 ms for marrow [18].

Figures 9A, 9B:
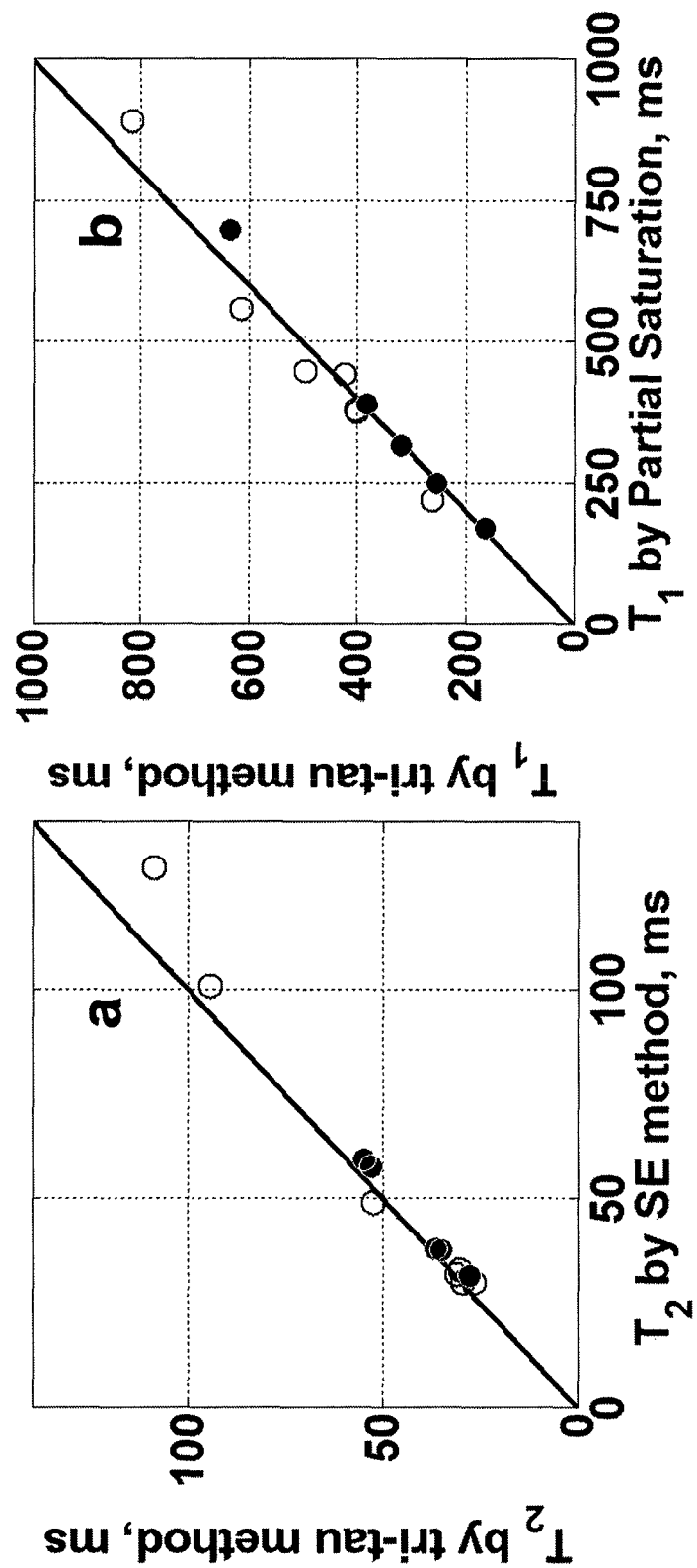
FIGS. 9A-9B show $T_2$ and $T_1$ as measured by a $\tau_3=2\tau_2$=20 ms Tri-$\tau$ experiment from 12×1.3 cm inner diameter, (ID; empty points) and 4×2.5 cm ID (filled points) phantoms, as compared with values measured using standard SE (a) and PS (b) methods (solid line=identity).

$T_2$ and $T_1$ values measured from the Tri-τ experiments on phantoms are compared with SE and PS $T_1$ and $T_2$ values in FIGS. 9A and 9B. The values show good agreement for all phantoms.

Discussion

Figure 6A:
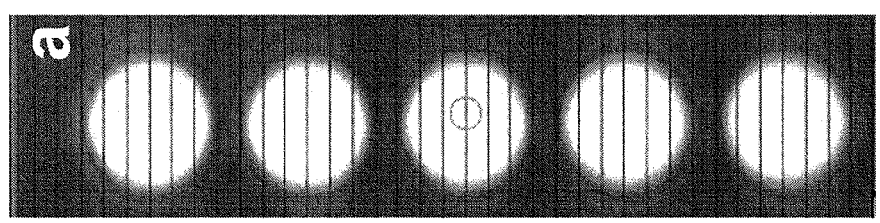
FIG. 6A shows a transverse image of 5 of the phantoms annotated with 5 mm thick 1DCSI slices (horizontal lines).

Long adiabatic pulses such as BIR-4 are self-refocusing but are subject to $T_2$ decay, resulting in attenuation by the end of the pulse. We have shown for the first time that $T_2$ measurements and $T_2$ image contrast can be obtained using these adiabatic pulse properties as distinct from conventional methods that use spin-echoes or 180° refocusing pulses. In particular, we have presented new NMR and MRI pulse sequences for measuring and imaging $T_2$ that can be performed in just two acquisitions employing long and short duration adiabatic pulses for NMR, or a long and no adiabatic pulse for MRI. These Dual-τ methods were validated with BIR-4 pulses by numerical analysis of the Bloch Equations, and experimentally by $^1$H NMR and MRI studies of phantoms of different $T_2$ s and MRI of the human foot, as compared with conventional SE $T_2$ measurements as the reference standard (FIGS. 5-7). Moreover, extension of the Dual-τ to the Tri-τ method resulted in a technique that not only delivered $T_2$ measurements but $T_1$ as well. The Tri-τ method was also validated by both simulations (FIG. 5) and experimental measurements on phantoms (FIG. 9).

As with existing techniques for measuring relaxation times, the Dual-τ and Tri-τ methods can be adversely affected by $B_1$-field nonuniformity when the adiabatic pulses are combined with conventional pulses such as those provided by MRI sequences (FIG. 2). The combined effect of an imperfect slice profile and $B_1$ inhomogeneity—to which higher-field MRI systems are intrinsically more susceptible—is significant. In order to cancel the denominator in Eq. (1) and obtain a ratio R from which $T_2$ can be determined using the Dual-τ method, we have must either set θ=90° or use a long TR. Obtaining an exact θ=90° slice-selective excitation pulse at 3T depends on the accuracy of the scanner's set-up routine. Our Dual-τ MRI studies of the foot benefited from the use of a 3D (slab-select) pulse sequence for both the Dual-τ and reference SE MRI, selection of just the middle slices, and a longer TR than we would have liked because of the uncertainty about the 90° pulse.

The delays of several milli-seconds added between the 0° BIR-4 pulse, the slice-selective pulse and the echo-times for the MRI sequences, will affect the total attenuation factor, reducing the SNR a little. This does not seem to affect $T_2$ in the Dual-τ MRI experiment where the delay is the same in both cases. Although the $S_1$ acquisition of the Tri-τ experiment does not have a delay while the $S_2$ and $S_3$ acquisitions do, the Tri-τ $T_2$ accuracy is also apparently unaffected.

The accuracy of $T_1$ s measured in the Tri-τ NMR experiment depends critically on the accuracy of the low-angle non-adiabatic 15° NMR excitation pulses set by the scanner [12] when non-adiabatic pulses are used. If MRI is not intended, an adiabatic 15° pulse could avoid this problem provided its duration is <<$τ_2$ to avoid a significant $3^{rd}$ $E_{p1}$ term in Eq (3). Meanwhile, the accuracy of $T_1$ imaging using a Tri-τ MRI sequence wherein the 60° BIR-4 pulses are replaced by 0° BIR-4 or BIRP pulses plus nominally −60° slice-selective pulses for $S_2$ and $S_3$ with a 15° slice-selective pulse for $S_1$, depends on the accuracy with which $B_1$ and/or the flip-angles are calibrated. Nevertheless, the Tri-τ pulse sequence is presently unique in demonstrating a potential for measuring and imaging $T_1$, $T_2$ and proton density (PD) from just 3 (albeit steady-state) acquisitions—all of which are FIDs, at that.

That the decay in magnetization during the BIR-4 pulse is essentially independent of FA enables decoupling of $T_2$ from the flip-angle, to the point of being able to provide a $T_2$ attenuation effect with otherwise zero excitation. In this application, the 0° BIR-4 pulse serves as a $T_2$ filter, removing the short $T_2$ components (FIG. 7A), while preserving the longer ones for an FID generated by a subsequent conventional excitation. This could be useful in spectroscopy for removing unwanted short-$T_2$ components that generate broad baselines. Also, the use of pre-pulses to add $T_2$ contrast bears similarity to $T_2$-prep MRI sequences, especially those employing adiabatic pulses[13]. Adiabatic $T_2$-prep MRI uses several very short 90° AHP and 180° AFP components with gaps between them to allow $T_2$ relaxation [13]. By using a (i) single, (ii) long, (iii) 0° BIR-4 or BIRP pulse, (iv) with no gaps, our sequence differs from this $T_2$-prep sequence in four ways. Moreover, the present example extends the application from providing $T_2$ contrast, to providing $T_2$ measurements.

Figure 10:
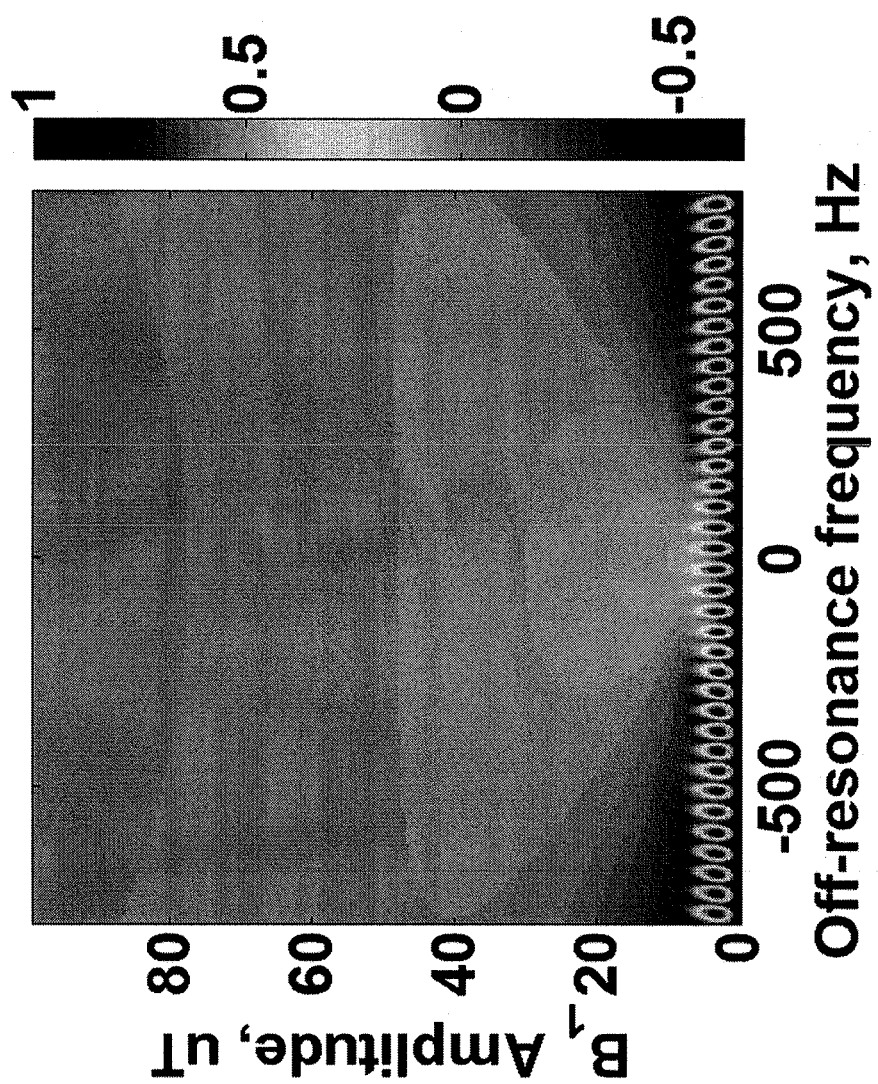
FIG. 10 shows contour plot of $M_z/M_{equ}$ (scale at right) as a function of off-resonance frequency using a 45 ms 0° BIR-4, $T_1$=1115 ms, and $T_2$=55 ms, for comparison with the 45 ms $T_2$-prep sequence in Ref. [13].

Conversely, the use of a single long 0° BIR-4 pulse instead of the short AHP/AFP pulses of the $T_2$-prep sequence[13] may offer some advantage. The single long BIR-4 (or BIRP) pulse has a much lower $B_1$-threshold to achieve adiabaticity than the short AHP and AFP pulses. As a consequence, it requires much lower peak power. For example, the simulations of a 45 ms AHP/AFP $T_2$-prep sequence from FIG. 4a of Ref. [13] showed an adiabatic threshold requirement for $B_1$ of about 20 μT. Performing the same simulation with the same $T_1$ and $T_2$ here, shows that use of a 45 ms 0° BIR-4 pre-pulse results in a $B_1$ threshold that is approximately 5 μT, or ¼ that of the adiabatic $T_2$-prep sequence, as shown in FIG. 10.

Figures 4A, 4B:
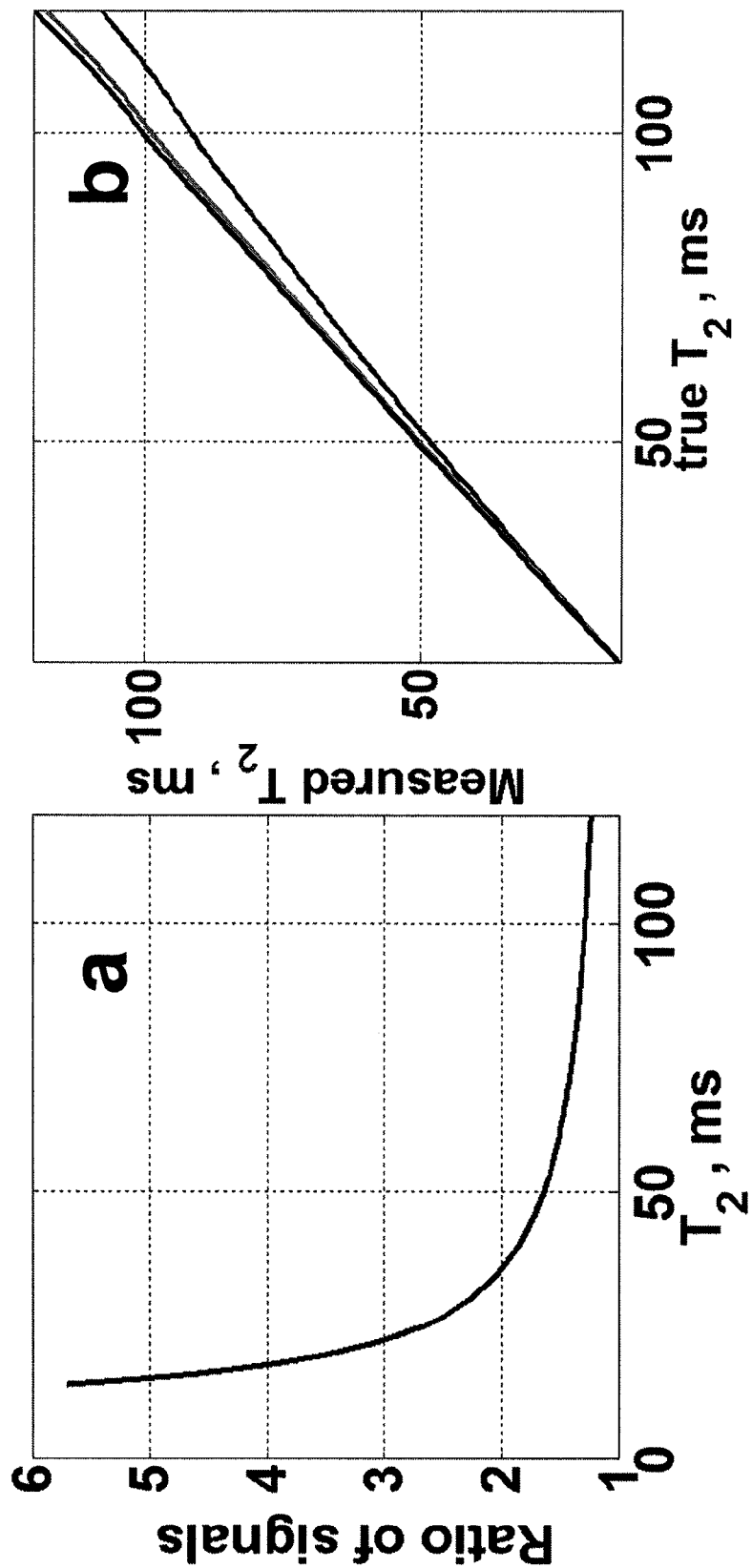
FIG. 4A provides a plot of the computed ratio R of two signals acquired with adiabatic pulses of length $\tau$=5 and 35 ms as a function of $T_2$. The curve has the form $$R(T_2) = \exp\left(\frac{-24.3}{T_2}\right).$$
FIG. 4B shows Dual-$\tau$ $T_2$ determined from part (FIG. 4A) as a function of $T_1$ (bottom, $T_1$=0.2 s; middle, T1=0.6 s; top, $T_1$=1.0 s). The result is substantially independent of TR.

Another question is whether the Dual-τ experiment with long adiabatic pulses measures either the inhomogeneously broadened $T_2$ ($T_2^*$) or the $T_1$ in the rotating frame ($T_{1ρ}$), as distinct from a pure $T_2$. First, $T_2^*$ results from local $B_0$-field inhomogeneity or offset frequency, to which a BIR-4 pulse operating above its adiabatic threshold is insensitive over a range of several hundred Hz[12]. In the present studies, analysis shows $T_2$ varies by less than 6.5% for offset frequencies in the range ±300 Hz, 30 ms≤$T_2$≤130 ms and TR=$T_1$=1 s, in our commercial 3T birdcage head-coil with $B_1$ of 20 μT. Second, $T_{1\rho}$ measures $T_1$ at the much lower NMR frequency corresponding to the $B_1$ field. Although it is not explicitly present in the Bloch Equations, $T_{1\rho}$ approaches $T_2$ as $B_1$ goes to zero, and behaves like a combination of low-frequency $T_1$ and $T_2$ [19]. As such, changes in $T_1$ might be expected to affect Dual-τ $T_2$ if it were sensitive to $T_{1\rho}$. However, analysis of the Dual-τ experiment showed variations <6% in $T_2$ over a 5-fold range of $T_1$ (FIG. 4B). In experiments, Dual-τ $T_2$ measured at a $B_1$ of 13.5 μT (knee coil) did not differ by more than 3% from those measured with $B_1$=20 μT (head coil) on the same short- and long-$T_2$ phantoms. Thus, $T_2^*$ and $T_{1\rho}$ do not appear to be significant factors affecting Dual-τ $T_2$ measurements in this work.

In conclusion, the Dual-τ method provides a new option for measuring $T_2$ without requiring any spin echoes, at least for short $T_2$ tissues such as muscle, cartilage and white matter [20] where the signal ratio affords adequate $T_2$ resolution (FIG. 4A). The same property delivered with an otherwise neutral 0° flip-angle self-refocusing adiabatic pulse can provide $T_2$-imaging, $T_2$-weighting, $T_2$-filtering (FIGS. 7, 8), or $T_2$-prep (FIG. 10). At the expense of one additional acquisition, the Tri-τ experiment offers the potential for obtaining all of the $T_2$, $T_1$ and proton or signal density information with just three acquisitions—arguably the minimum possible—with the caveat that it requires accurate setting and knowledge of the flip-angles. These new methods can potentially save time and simplify relaxation measurements and/or contrast-weighted NMR and MRI.

REFERENCES

[1] A. Abragam, The Principles of Nuclear Magnetism, Oxford, Clarendon Press, (1961) 599.
[2] D. G. Norris, Adiabatic radiofrequency pulse forms in biomedical nuclear magnetic resonance, Concepts in Magnetic Resonance, 14 (2002) 89-101.
[3] R. A. De Graaf, K. Nicolay, Adiabatic rf pulses: Applications to in vivo NMR, Concepts in Magnetic Resonance, 9 (1997) 247-268.
[4] M. S. Silver, R. I. Joseph, D. I. Hoult, Highly selective [pi]/2 and [pi] pulse generation, Journal of Magnetic Resonance (1969), 59 (1984) 347-351.
[5] C. J. Hardy, W. A. Edelstein, D. Vatis, Efficient adiabatic fast passage for NMR population inversion in the presence of radiofrequency field inhomogeneity and frequency offsets, J. Magn. Reson., 66 (1986) 470-482.
[6] M. Garwood, Y. Ke, Symmetric pulses to induce arbitrary flip angles with compensation for rf inhomogeneity and resonance offsets, Journal of Magnetic Resonance (1969), 94 (1991) 511-525.
[7] P. A. Bottomley, R. Ouwerkerk, BIRP: an improved implementation of low-angle adiabatic (BIR-4) excitation pulses, J. Magn. Reson. Ser. A, 103 (1993) 242-244.
[8] M. Robin Bendall, M. Garwood, K. Ugurbil, D. T. Pegg, Adiabatic refocusing pulse which compensates for variable of power and off-resonance effects, Magnetic Resonance in Medicine, 4 (1987) 493-499.
[9] A.-M. El-Sharkawy, M. Schar, R. Ouwerkerk, R. G. Weiss, P. A. Bottomley, Quantitative Cardiac $^{31}$P Spectroscopy at 3 Tesla Using Adiabatic Paulses, Magnetic Resonance in Medicine, 61 (2009).
[10] S. Meiboom, D. Gill, Modified Spin-Echo Method for Measuring Nuclear Relaxation Times, Review of Scientific Instruments, 29 (1958) 688-691.
[11] P. A. Bottomley, W. A. Edelstein, NMR imaging of the transverse relaxation time using multiple spin echo sequences. U.S. Pat. No. 4,521,733 (1985). General Electric Company (Schenectady, N.Y.).
[12] P. A. Bottomley, R. Ouwerkerk, The Dual-Angle Method for Fast, Sensitive T1 Measurement in Vivo with Low-Angle Adiabatic Pulses, Journal of Magnetic Resonance, Series B, 104 (1994) 159-167.
[13] R. Nezafat, R. Ouwerkerk, A. J. Derbyshire, M. Stuber, E. R. McVeigh, Spectrally selective B1-insensitive $T_2$ magnetization preparation sequence, Magnetic Resonance in Medicine, 61 (2009) 1326-1335.
[14] P. A. Bottomley, W. A. Edelstein, Method of eliminating effects of spurious free induction decay NMR signal caused by imperfect 180 degrees pulses. U.S. Pat. No. 4,484,138 (1984). General Electric Company (Schenectady, N.Y.).
[15] J. Bittoun, J. Taquin, M. Sauzade, A computer algorithm for the simulation of any Nuclear Magnetic Resonance (NMR) imaging method, Magnetic Resonance Imaging, 2 (1984) 113-120.
[16] K. Yoshimura, H. Kato, M. Kuroda, A. Yoshida, K. Hanamoto, A. Tanaka, M. Tsunoda, S. Kanazawa, K. Shibuya, S. Kawasaki, Y. Hiraki, Development of a tissue-equivalent MRI phantom using carrageenan gel, Magnetic Resonance in Medicine, 50 (2003) 1011-1017.
[17] A. Naressi, C. Couturier, J. M. Devos, M. Janssen, C. Mangeat, R.d. Beer, D. Graveron-Demilly, Java-based Graphical User Interface for the MRUI Quantitation Package, MAGMA, 12 (2001) 141-152.
[18] G. E. Gold, E. Han, J. Stainsby, G. Wright, J. Brittain, C. Beaulieu, Musculoskeletal MRI at 3.0 T: Relaxation Times and Image Contrast, Am. J. Roentgenol., 183 (2004) 343-351.
[19] P. R. Moran, C. A. Hamilton, Near-resonance spin-lock contrast, Magnetic Resonance Imaging, 13 (1995) 837-846.
[20] N. Gelman, J. M. Gorell, P. B. Barker, R. M. Savage, E. M. Spickler, J. P. Windham, R. A. Knight, MR Imaging of Human Brain at 3.0 T: Preliminary Report on Transverse Relaxation Rates and Relation to Estimated Iron Content, Radiology, 210 (1999) 759-767.

Examples 2

Conventional MRI of relaxation times is done using the partial saPS or IR methods for $T_1$, and the SE method for $T_2$. In addition, $B_1$ field mapping is often required to correct for inhomogeneity in the RF magnetic field, $B_1$. All of these measurements require multiple acquisitions. Here we present three embodiments—Tri-τ, Dual-τ/dual-TR, and Tri-FA—that accomplish this with the least possible number of acquisitions. Three are used for measuring and imaging the nuclear (or proton) spin density (PD, denoted $M_0$), $T_1$ and $T_2$, while four acquisitions are used for measuring $M_0$, $T_1$, $T_2$, and $B_1$. All methods measure $T_2$ without spin echoes, based on the $T_2$ attenuation effect imparted by the application of long-duration adiabatic pulses as noted above[1]. $T_2$ contrast can also be imparted in images by adding a 0° non-selective adiabatic prepulse (a BIR4 pulse in this case) to a spatially-selective imaging sequence. The $T_1$ information can be measured by either varying the flip angle (FA) [2] according to the Tri-τ method described herein, or by varying the repetition time (TR), in accordance with the Dual-τ/dual-TR method. The third, Tri-FA method determines $T_1$, $B_1$, $M_0$ by varying the FAs in three SPGR acquisitions, followed by a fourth acquisition in which the signal is attenuated by $T_2$ after application of an adiabatic pre-pulse.

The in vitro validation of all three methods is compared herein with standard measurements. In addition, in vivo results from the human brain are obtained for the Tri-τ method.

Theory

The long adiabatic pulse attenuates the MR signal magnitude as a function of $T_2$. After (denoted time 0+) applying a FA=θ° adiabatic pulse with T pulse length, the longitudinal magnetization has magnitude:

$$M_z(0+) = \cos\theta \cdot M_z(0-) E_p \quad (2.1)$$

compared to before the pulse (at time 0−), and the transverse magnetization is [1]:

$$M_{xy} = \sin\theta \cdot M_z(0-) \cdot E_p. \quad (2.2)$$

The $T_2$ attenuation factor is:

$$E_p = \exp(-g \cdot \tau/T_2), \quad (2.3)$$

for a pulse length 5 ms≤τ≤40 ms, where g=0.81 at maximum frequency sweep of the pulse fmax=15 kHz, $B_1$=20 μT[3] and g=0.72 at fmax=5 kHz, $B_1$=13.5 uT. Applying the adiabatic pulse with a repetition time (TR), the steady state signal $$M_{xy} = M_0 \cdot (1-E_1) \cdot \sin\theta \cdot E_p/(1-\cos\theta \cdot E_1 \cdot E_p), \quad (2.4)$$

where $E_1 = \exp(-TR/T_1)$. To implement a spatially-selective sequence for imaging $T_2$, a 0° long adiabatic pre-pulse is followed by a short slice selective "imaging" pulse, which gives a similar steady-state signal, providing that $E_p$ is independent of FA and the $T_2$ decay during the short imaging pulse is negligible. The $T_2$ portion of the measurement of the following three methods are based on this effect.

1. Tri-τ $T_2$, $T_1$ and Spin Density Measurements and Imaging

In the Tri-τ method, both $T_1$ and $T_2$ are measured with just three steady-state acquisitions. With knowledge of both $T_1$ and $T_2$, the equilibrium magnetization $M_0$ is also determinable. Three acquisitions is the minimum possible for determining the three independent parameters, $T_1$, $T_2$, and $M_0$. $T_1$ is measured analogous to the Dual-FA T1 method [2]. Here, two of the acquisitions use the same TR, but are applied with two different excitation FAs, α° and β°. To measure $T_2$, a long and a short adiabatic pre-pulse are implemented before two short-duration (<<$T_2$) β° RF excitations respectively. The ratio of the two signals derived therefrom is used for the $T_2$ calculation, and cancels out the effect of systemic effects during the other sequence delays. The solution for $T_1$ and $T_2$ were presented earlier [3], and are reproduced below for clarity.

In the basic Tri-τ method for measuring $T_1$ and $T_2$: 1) a first steady-state equilibrium signal $S_1$ is acquired with a conventional short α RF excitation pulse without adiabatic excitation; 2) a second steady-state equilibrium signal $S_2$ is excited by a β adiabatic pulse of duration $\tau_2$; and 3) a third steady-state equilibrium signal $S_3$ is excited by a β adiabatic of length $\tau_3=2\tau_2$. The three steady-state signals are:

$$S_1 = \frac{(1-E_1)\sin\alpha}{(1-E_1\cos\alpha)} M_0, \quad S_2 = \frac{(1-E_1)E_{p2}\sin\beta}{(1-E_1 E_{p2}\cos\beta)} M_0 \quad (2.5)$$

and $$S_3 = \frac{(1-E_1)E_{p3}\sin\beta}{(1-E_1 E_{p3}\cos\beta)} M_0$$

Using the same $B_1$ and $f_{max}$ for both adiabatic pulses yields $E_p = e^{-g\tau/T_2}$, $E_{p3} = E_{p2}^2$, and Eq. 2.5 simplifies to a quadratic:

$$aE_{p2}^2 + bE_{p2} + c = 0, \quad (2.6)$$

where $$a = S_1 \sin\beta \cos\beta \sin\alpha(S_3 - S_2)$$

$$b = S_1 S_2 \sin\alpha \cos\alpha \sin\beta - s_2 s_3 \sin^2\alpha \cos\beta,$$

and $$c = S_2 S_3 \sin^2\alpha \cos\beta - S_1 S_3 \sin\alpha \cos\alpha \sin\beta.$$

Choosing the root of Eq. (2.6) that falls in the interval (0, 1) yields the $T_2$ attenuation factor $$E_{p2} = \frac{-b \pm \sqrt{b^2 - 4ac}}{2a}. \quad (2.7)$$

Substitution of Eq. (2.7) into Eq. (2.5) yields the $T_1$ exponential decay factor:

$$E_1 = \frac{S_2 \sin\alpha - S_1 \sin\beta E_{p2}}{(S_2 \sin\alpha \cos\beta - S_1 \cos\alpha \sin\beta) E_{p2}} \quad (2.8)$$

or $$E_1 = \frac{S_3 \sin\alpha - S_1 \sin\beta E_{p3}}{(S_3 \sin\alpha \cos\beta - S_1 \cos\alpha \sin\beta) E_{p3}}.$$

This is similar to the dual-angle equation [2] except that it includes an $E_{p2}$-attenuation correction. Thus, from $E_{p2}$ and $E_1$:

$$T_2 = -\frac{g \cdot \tau_2}{\ln(E_{p2})} \quad (2.9)$$

and $$T_1 = -\frac{TR}{\ln(E_1)}.$$

The above general recipe of steps 1-3 for Tri-τ measurements is modified or made specific for an MRI sequence as follows: 1) a first image in which signal $S_1$ is acquired with a conventional short α° slice selective excitation pulse without adiabatic excitation; 2) a second image $S_2$ is excited by a 0° adiabatic pulse of duration $\tau_2$ followed by a β° slice selective pulse; and 3) a third image $S_3$ is excited by a 0° adiabatic of length $\tau_3=2\tau_2$ followed by the same β pulse. In an embodiment, TR is identical for all three acquisitions. $T_1$ and $T_2$ are derived from Eq. (2.9) above for each image pixel, yielding the equilibrium magnetization from Eq. (2.5).

2. Dual-TR Dual-τ Method $T_1$ measurement can alternatively be incorporated in the minimum acquisition sequence by varying TR instead of FA. This requires a minimum of two signals whose amplitudes are fit to a steady state equation for the MR signal at the corresponding TR values. Adding an adiabatic pre-pulse of varying duration is again used to encode the $T_2$ information for imaging purposes (see Table above for a summary of both basic and imaging embodiments). Again, this can still be accomplished with the minimum possible number of acquisitions required to measure the three independent variables, $T_1$, $T_2$ and $M_0$, three.

Thus, the dual-TR dual-$\tau$ method combines the two variations involving TR and adiabatic pulse duration, in the following three acquisitions. Step 1: steady-state signal $S_1$ is acquired in the steady-state at a short TR, denoted TR1, with a short 0° adiabatic pre-pulse of length $T_1$ followed by an $\alpha$° excitation pulse, which is a spatially selective pulse when the sequence is being used for imaging (T1, T2, and M0). Step 2: steady-state signal $S_2$ is acquired in the steady-state with the same adiabatic pre-pulse of length $\tau_1$ followed by the $\alpha$° excitation pulse (which is spatially selective when the sequence is being used for imaging) but at a long TR of TR2=2*TR1. Step 3: steady-state signal $S_3$ is acquired with an adiabatic pre-pulse of duration $\tau_2=2\tau_1$, followed by the $\alpha$° excitation pulse (which is spatially selective when the sequence is being used for imaging) at TR2. The three resulting signals are:

$$S_1 = M_0 \frac{(1-E_1)E_{p2}\sin\alpha}{1-E_1 E_{p2}\cos\alpha} \quad (2.10)$$

$$S_2 = M_0 \frac{(1-E_1')E_{p2}\sin\alpha}{1-E_1' E_{p2}\cos\alpha}$$

$$S_3 = M_0 \frac{(1-E_1')E_{p3}\sin\alpha}{1-E_1' E_{p3}\cos\alpha}$$

Where $E_{p2}$, $E_{p3}$ are the adiabatic attenuation factors and $E_{p2}=\exp(-g\cdot\tau 1/T_2)$, $E_{p3}=\exp(-g\cdot\tau_2/T_2)$. $E_1$, $E_1'$ are the $T_1$ relaxation attenuation factors $E_1=\exp(-TR1/T_1)$, and $E_1'=\exp(-TR2/T_1)$. Since we set $T_2=2\tau_1$, TR2=2TR1, we have $E_{p3}=E_{p2}^2$, $E_1'=E_1^2$.

This equation set is solved by iteration wherein initial values of $M_0$, $E_1$, $E_{p2}$, are set then iteratively corrected via:

$$E_{p2} = \frac{S_3}{S_2} \frac{1-E_1^2 E_{p2}\cos\alpha}{1-E_1^2 E_{p2}^2\cos\alpha} \quad (2.11)$$

$$E_1 = \frac{S_2}{S_1} \frac{1-E_1^2 E_{p2}\cos\alpha}{1-E_1 E_{p2}\cos\alpha} - 1$$

$$M_0 = \frac{S_1}{(1-E_1)E_{p2}} \frac{1-E_1 E_{p2}\cos\alpha}{\sin\alpha}$$

Using $\alpha=90°$ will eliminate the variables resulting in simple analytical solutions:

$$E_{p2} = \frac{S_3}{S_2} \quad (2.12)$$

$$E_1 = \frac{S_2}{S_1} - 1$$

$$M_0 = \frac{S_1}{(1-E_1)E_{p2}}$$

However, in the presence of an inhomogeneous RF field, $B_1$, the FA will not be 90° everywhere. In this case, the FA acquired by actual flip angle imaging (AFI) is substituted into the iteration to determine the actual $E_1$, $E_{p2}$ and $M_0$.

From these we obtain $$T_1 = -\frac{TR}{\ln(E_1)}$$

and $$T_2 = \frac{g \cdot \tau_1}{\ln(E_{p2})}.$$

The algorithm usually converges after about 10 iterations.

3. Tri-FA Method

The accuracy of these methods depends in part on having accurate knowledge of the FA. Fast FA mapping techniques such as AFI or as provided by the MRI scanner, require at least two acquisitions and their accuracy is limited by slice thickness [4]. Thus under circumstances of imperfect knowledge of FA that requires an FA determination, the dual-FA and Dual-TR/Dual-tau methods would actually require at least five acquisitions in order to calculate $T_1$, $T_2$ and $M_0$. The purpose of the Tri-FA method is to overcome this limitation by including the $B_1$/FA determination as part of the same sequence. The minimum possible number of acquisitions required to measure the four independent parameters $T_1$, $T_2$, $M_0$, and FA, is four. The Tri-FA method indeed achieves this.

In the Tri-FA method applied to image $T_1$, $T_2$, and $M_0$, three signals $S_1$, $S_2$ and $S_3$ are each acquired at steady-state, as spoiled gradient refocused echo signals excited by (spatially-selective MRI) pulses with different FAs, $\theta_1$, $\theta_2$, and $\theta_3$. In a preferred embodiment, these pulses are all applied with the same TR. A fourth signal, $S_4$ is acquired with a 0° adiabatic pre-pulse of duration $\tau_1$ followed by a $\theta_4$ (spatially selective) excitation, at a repetition time TR4. The duration $\tau_1$ is chosen to be sensitive to a $T_2$ of the sample and is typically chosen to be comparable to, or a significant fraction of the $T_2$. In this case the actual FA is equal to the nominal FA scaled by a factor $\alpha$, reflecting the actual $B_1$ field strength which may vary due to inhomogeneity at each (pixel) location. The steady-state signals are given by:

$$S_1 = \frac{M_0(1-E_1)\sin(\alpha\cdot\theta_1)}{1-E_1\cos(\alpha\cdot\theta_1)} \quad (2.13)$$

$$S_2 = \frac{M_0(1-E_1)\sin(\alpha\cdot\theta_2)}{1-E_1\cos(\alpha\cdot\theta_2)}$$

$$S_3 = \frac{M_0(1-E_1)\sin(\alpha\cdot\theta_3)}{1-E_1\cos(\alpha\cdot\theta_3)}$$

$$S_4 = \frac{M_0(1-E_1')\sin(\alpha\cdot\theta_4)E_p}{1-E_1'\cos(\alpha\cdot\theta_4)E_p}$$

The $B_1$ scaling factor, a, proton density $M_0$, and $T_1$ attenuation factor $E_1$ are solved by three-coefficient least-square fitting to the signal curve with $x=[\theta_1, \theta_2, \theta_3]$, $y=[S_1, S_2, S_3]$, coeff=$[M_0, E_1, \alpha]$, minimizing $\|F(x,\text{coeff})-y\|_2^2$. From $E_1$, we obtain $$T_1 = -\frac{TR}{\ln(E_1)},$$

and substituting $M_0$, $\alpha$, and $$E_1' = \exp\left(\frac{-TR4}{T1}\right)$$

into $S_4$, obtains the $T_2$ attenuation factor $E_p$, from which $$T_2 = -\frac{g \cdot \tau}{\ln(E_p)}.$$

It will be seen that in this embodiment, sequence signals $S_1$, $S_2$, and $S_3$ do not include adiabatic pulses while $S_4$ does, which can render the results sensitive to factors affecting $S_4$ during the evolution period extending from the adiabatic pulse to the excitation (FIG. 2). To ameliorate this problem in a second embodiment, adiabatic 0° pre-pulses are also added to the acquisitions for $S_1$, $S_2$, and $S_3$. The adiabatic pulses applied for $S_1$, $S_2$, and $S_3$ in this case, are all chosen with durations much shorter than $T_2$, while the sequences, especially the delay between the adiabatic pulse and the excitation pulse, are otherwise unchanged (for example the adiabatic pulse durations may all be equal and $\ll T_2$). Under these conditions, equation 2.13 remains applicable while the accuracy of the relaxation measurements are improved since all acquisitions are subject to the same evolution between the adiabatic and subsequent excitation.

Materials and Methods

Embodiments of the present method were evaluated by both numerical analysis and experimental studies.

Numerical Simulations

Monte Carlo simulations of all three method embodiments have been performed. The signal's evolution was simulated using the Bloch equations for proton relaxation at 3T. The standard deviation of the noise was set at 2% of the signal strength. The mean and SD of the Bloch equation solutions for $T_1$ and $T_2$ were determined from 100 simulations as a function of $T_1$ and/or $T_2$. $T_1$ sensitivity was determined for $0.3 s \leq T_1 \leq 1.5 s$ with $T_2=80$ ms and chosen values of TR. $T_2$ sensitivity was determined for $0 \leq T_2 \leq 80$ ms for Tri-τ and Dual-τ/dual TR embodiments, and for $0 \leq T_2 \leq 190$ ms for the Tri-FA embodiment with $T_1=1$ s. The BIR-4 pulse was chosen as the adiabatic pulse, with the following experimental parameters: $B_1=13.5$ μT, $f_{max}=5$ kHz for Tri-τ; and B1=20 μT, $f_{max}=15$ kHz for both the Dual-τ/dual TR method and Tri-FA methods. The pulse length was set to $\tau_3=2\tau_2=20$ ms for Tri-τ measurements; $\tau_2=2\tau_1=20$ ms for dual-τ/dual TR measurements; and $\tau_1=20$ ms for Tri-FA measurements for comparable $T_2$ resolution.

Phantom Preparation

Phantoms with different $T_1$ and $T_2$ values were prepared in cylinders using agarose and copper sulfate solutions with relaxation values of $31 ms \leq T_2 \leq 230$ ms, $186 ms \leq T_1 \leq 1500$ m as measured by standard PS and SE methods on the same day that each method was tested. These are in a range of those exhibited by many tissues in the human body.

MRI Measurements

All MRI measurements were done on a 3T Achieva Philips MRI scanner. For the phantom study, standard $T_1$ value is measured by PS method with 3D gradient echo (GRE) sequence with TR=100, 300, 600, 900, 1200, 2000 ms, FA=90°. Standard $T_2$ is measured by SE with a 3D 32-echo sequence, TE=[1:32]*10 ms, TR=1200 ms. The $T_1$ and $T_2$ value were then calculated by pixel-by-pixel nonlinear least square fitting the signal value to the relaxation curve ({w·exp(-TE/$T_2$)} and {u-v·exp(-TR/$T_1$)} with u, v, w constants). All method embodiments were validated in 3D to avoid errors due to slice profile imperfections: only the middle slice was used. The BIR-4 pulse FA of 0° was calibrated at the pulse lengths used in each sequence by ensuring a signal minimum.

Results

Numerical Analysis

Figure 13A:
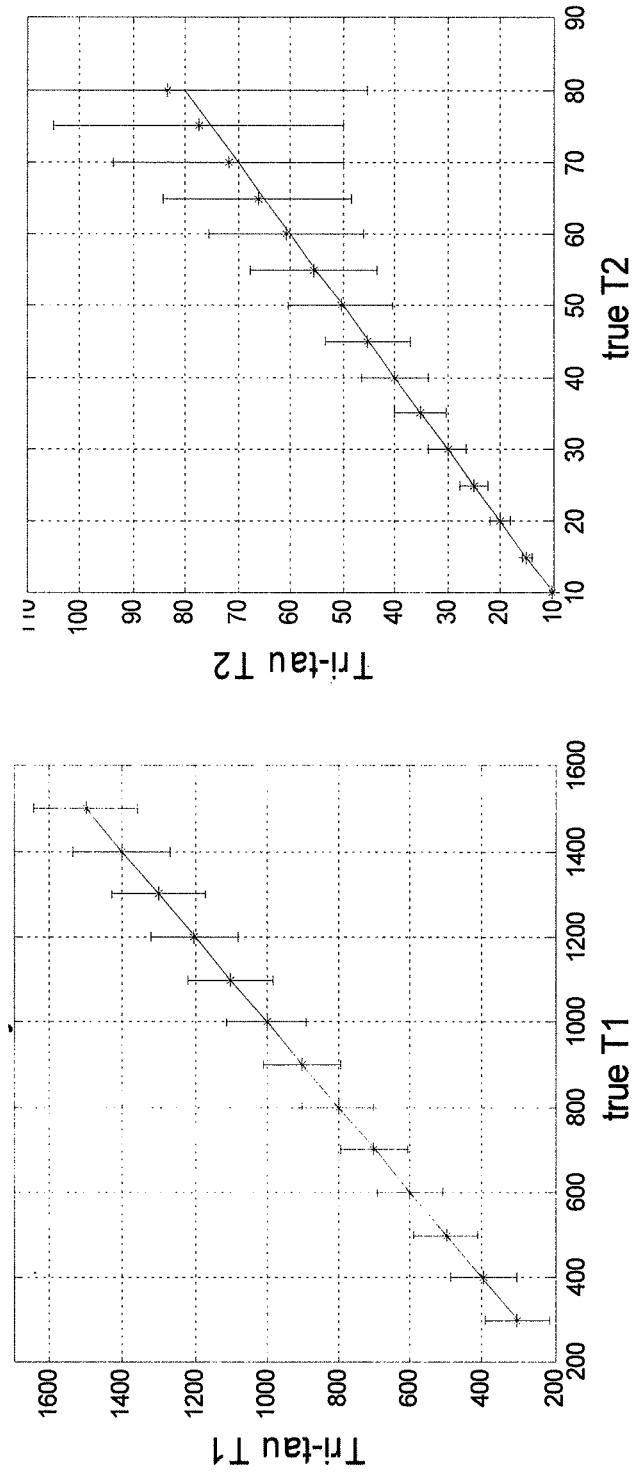
FIGS. 13A-13C provide Monte Carlo simulations of the error in measured $T_1$ s (with $T_2$=80 ms) and $T_2$ s (with $T_1$=1 s) with 2% SNR and 100 points.
Figure 13B:
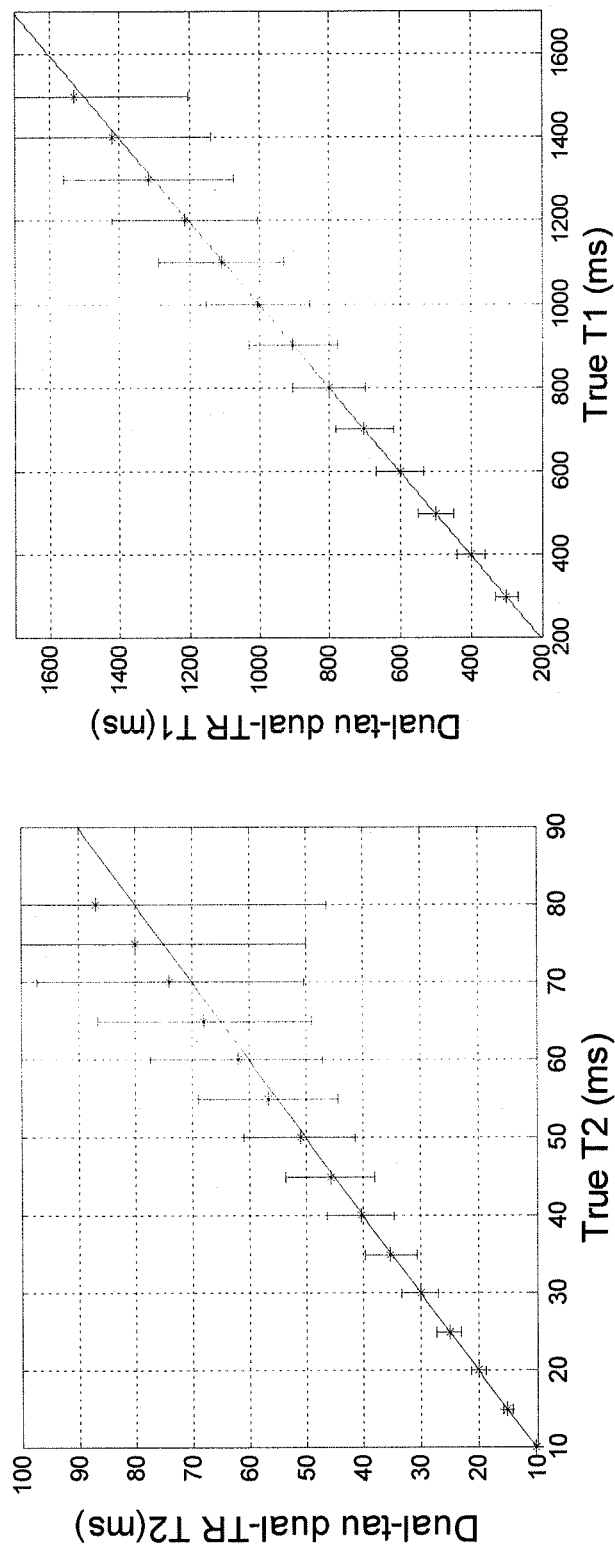
Figure 13C:
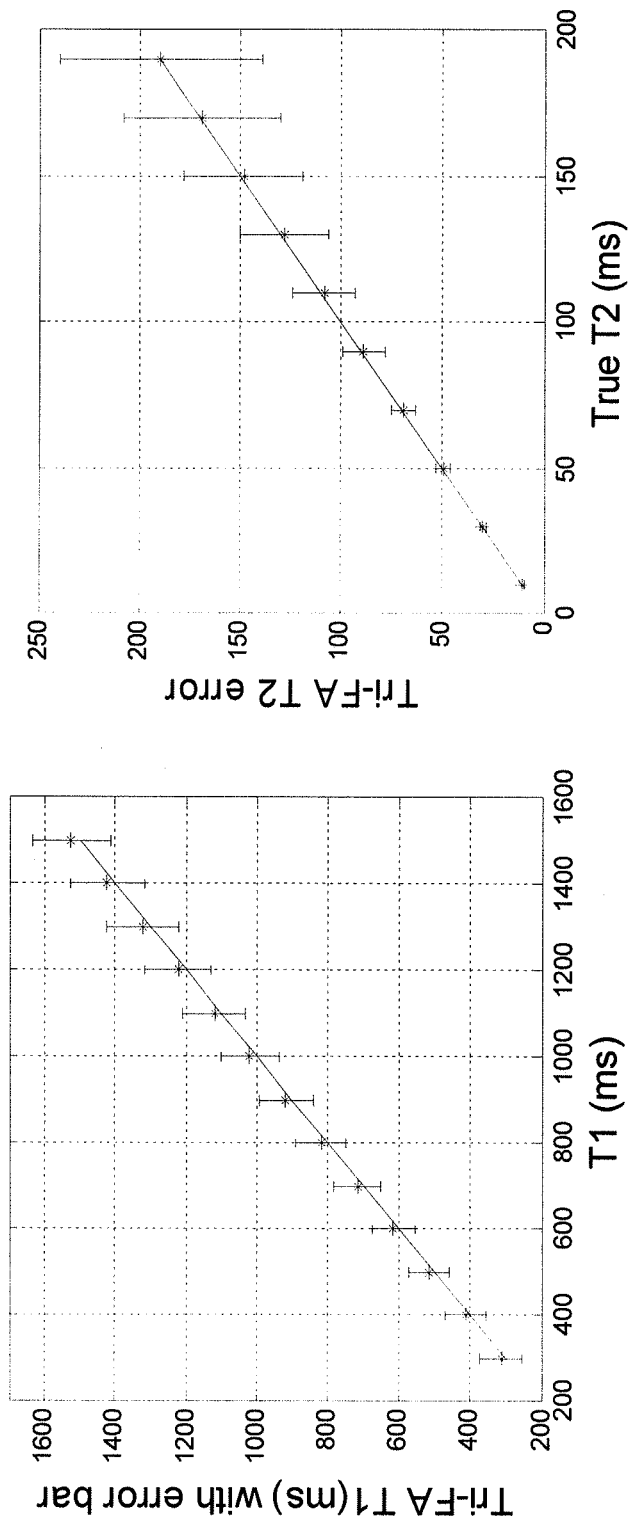

The Tri-τ embodiment was evaluated using the two FAs of α=15° and β=60° previously determined for the dual-angle method[2]. The Monte Carlo simulation of $T_1$ measured by the Tri-τ embodiment was not affected by the pre pulse length $\tau_2$. With TR=609 ms, $T_2$=80 ms, $\tau_3$=20 ms, the mean $T_1$ error at $T_1$=1000 ms is 0.6%±11% (FIG. 13A). The error monotonically decreased from 30.2% to 9.4% as $T_1$ increases from 0.3 s to 1.5 s. However, increasing TR causes the calculated $T_1$ mean value to deviate from the true value. With $T_1$=1000, TR=609 ms, $\tau_2$=10 ms, mean $T_2$ error at 45 ms is 1%±18% (FIG. 13A).

Figure 11:
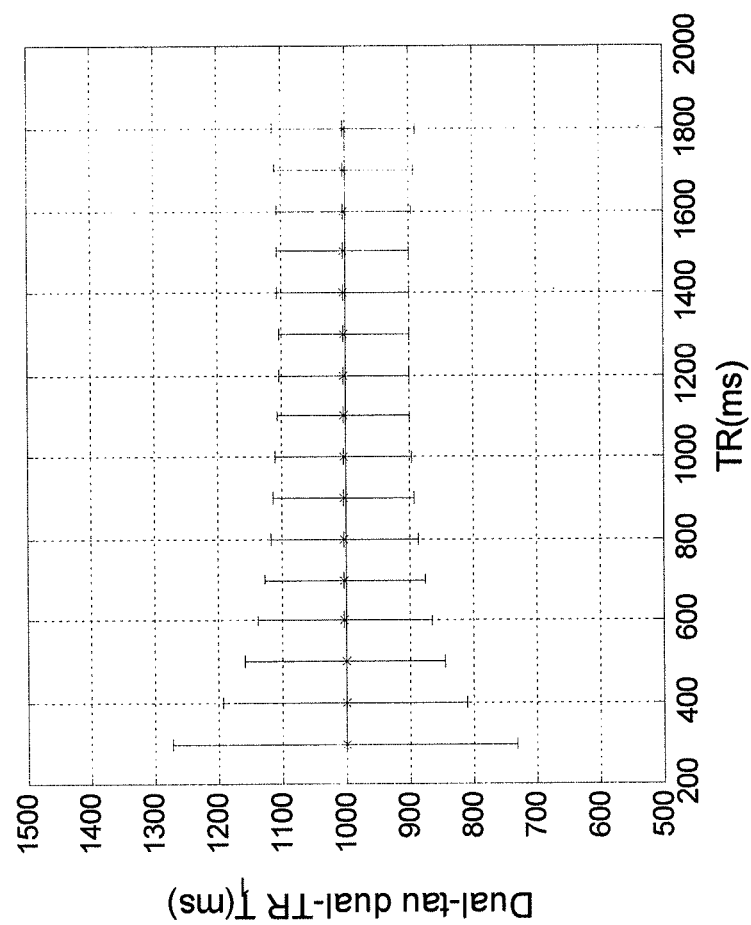
FIG. 11 shows Monte Carlo simulations of measured $T_1$ error vs. TR with the dual-$\tau$ dual TR method.
Figure 12A:
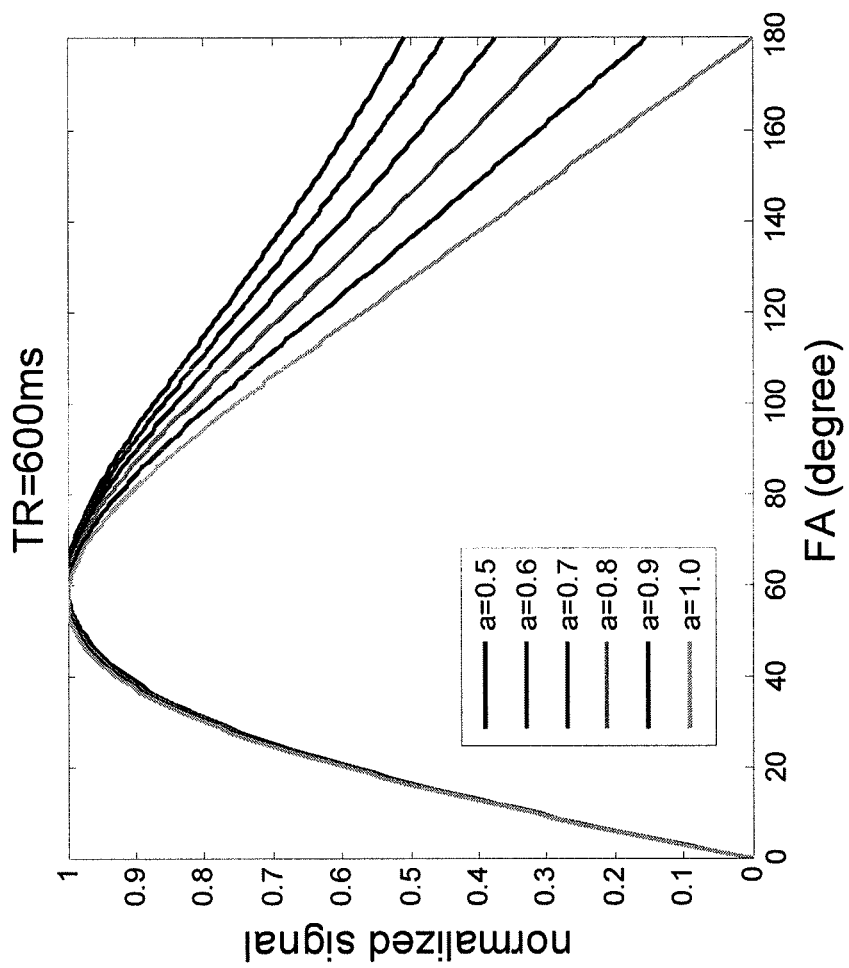
FIG. 12A shows normalized signal curve vs. FA for $\alpha$=0.5-1.0 at TR=0.6 s, T1=1 s. The curves intersecting the vertical axis at right are calculated with a=0.5, a=0.6, a=0.7, a=0.8, a=0.9, and a=1.0, from top to bottom, respectively.
Figure 12B:
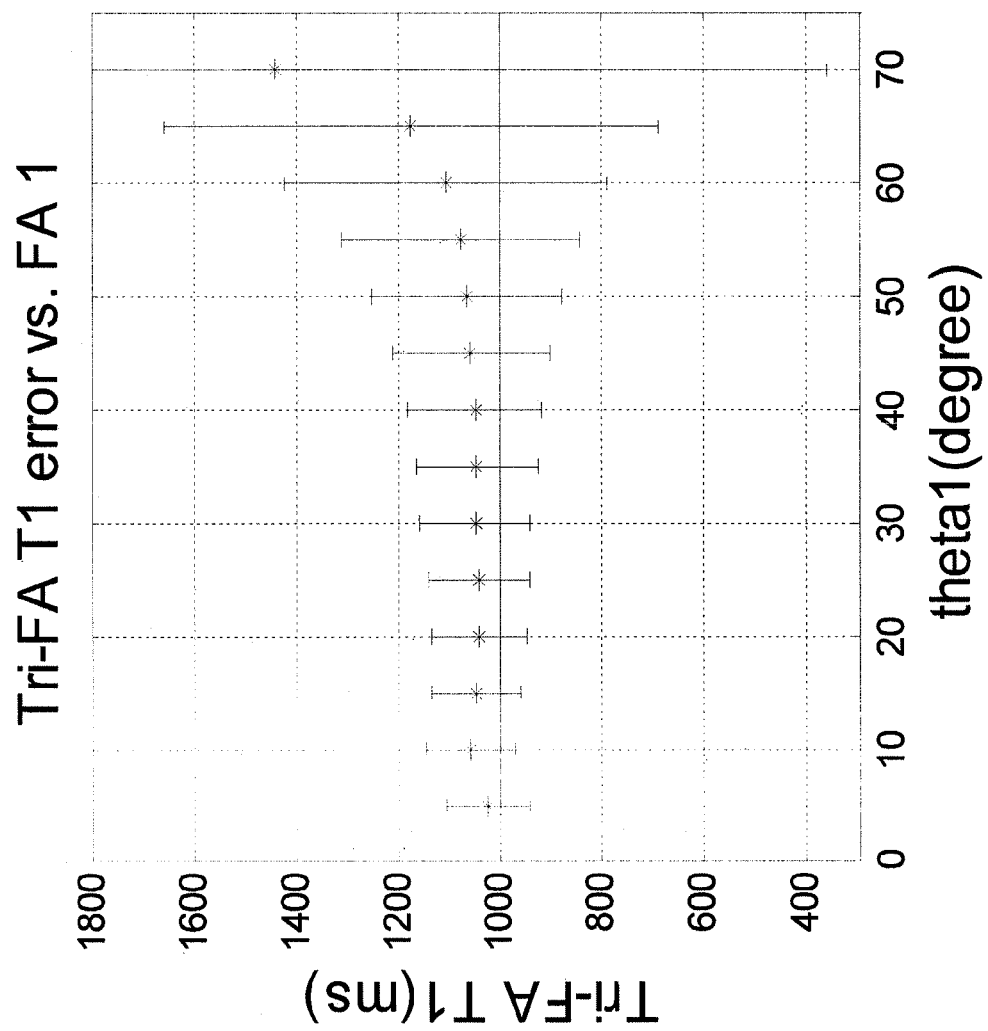
FIGS. 12B-12D show Monte Carlo simulations of the error in Tri-FA (flip-angle) $T_1$, as a function of $\theta_1$ $\theta_2$ $\theta_3$ respectively with true $T_1$=1 s, TR=0.6 s.
Figure 12C:
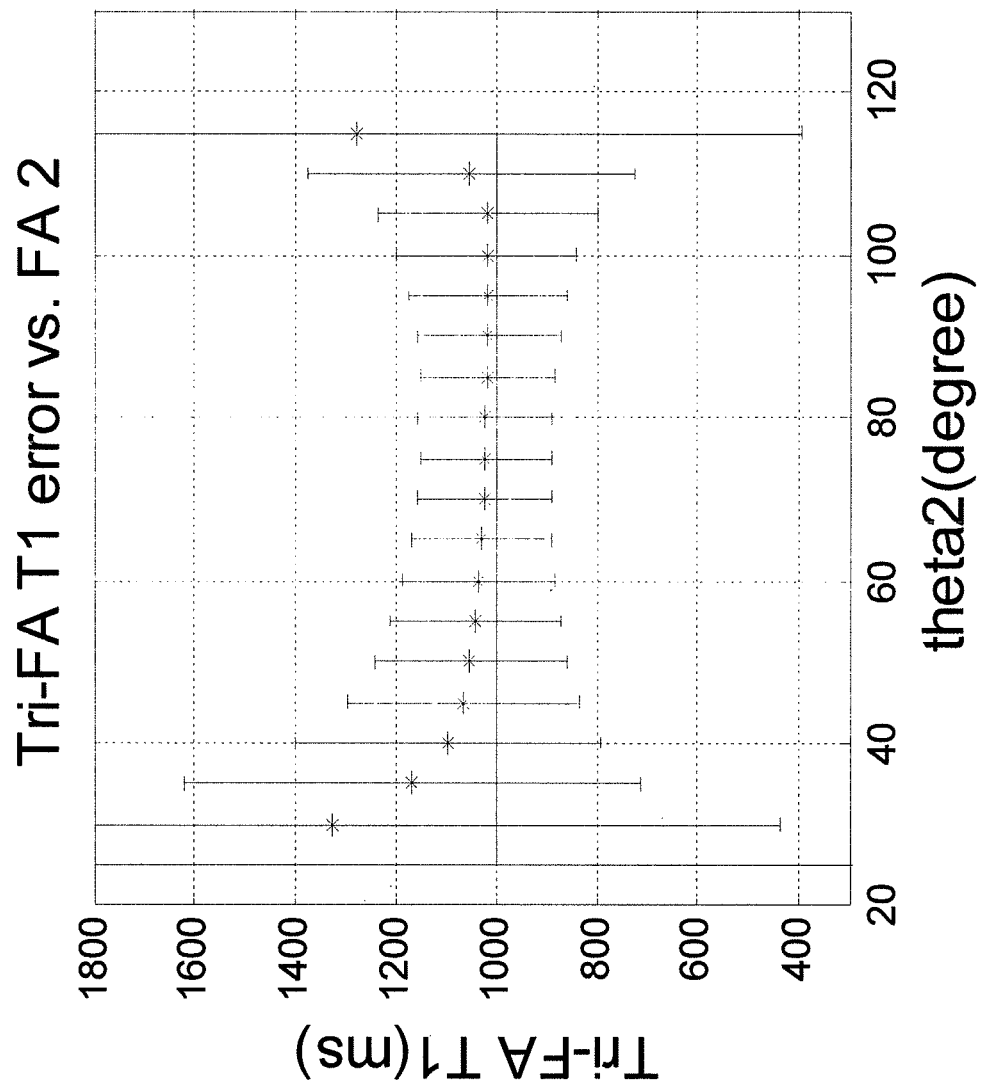
Figure 12D:
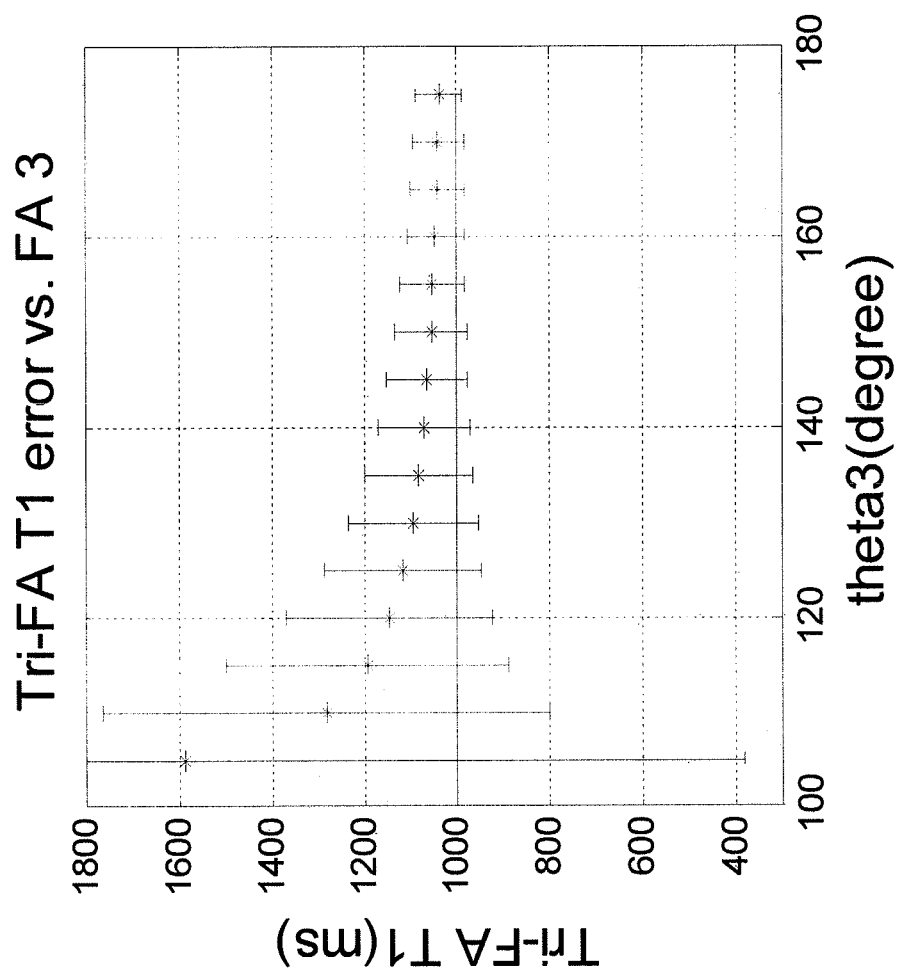

In the Dual-τ dual-TR embodiment, to eliminate the variables in $M_0$, $E_1$, $E_{p2}$ calculation to the largest extent, we use nominal FA=90° for all three acquisitions. TR is also determined by Monte Carlo simulation of $T_1$ errors for $0.3 \leq TR1 \leq 1.8$ s with $T_1$=1 s, $T_2$=80 ms and 2% SNR, since TR1 does not affect $T_2$ measurement. The results indicate that the SD of measured $T_1$ decreases from 27% to 15.7% as TR increases from 0.3 s to 0.5 s, while TR1=1.2 s provides the most accurate $T_1$ with an SD=10% (FIG. 11). As a tradeoff between scan time and measurement accuracy, we chose TR1=0.53 s for Dual-τ dual-TR experiments, which enabled us to use $\tau_1$=10 ms at this TR and operate within our scanner's RF power constraints. With TR=0.53 s, $T_2$=80 ms, $\tau_1$=10 ms, $T_1$ error of the Dual-τ dual-TR measurement varied from 0.6%±10.6% to 1.9%±21.6% for $0.3 s \leq T_1 \leq 1.5$ s. Increasing TR improves the measured $T_1$ accuracy. $T_2$ error for $T_2$=45 ms is 1.8±17%.

Selection of FAs for the of Tri-FA embodiment employing a single τ1 adiabatic pulse was determined by Monte Carlo simulation of the measured $T_1$ error vs. $\theta_1$, $\theta_2$ and $\theta_3$ respectively, leaving one variable FA, and fixing the other two. FIG. 12 shows the optimum $\theta_2$ is around 80°, while the error monotonically increases as $\theta_1$ increases and monotonically decreases as $\theta_3$ increases (up to 180°). To ensure sufficient image SNR and restrict FA<180° with 20% of $B_1$ variation, values of $\theta_1$=20° and $\theta_3$=140° yield near optimal results. For acquiring $S_4$, the only concern is $T_2$ accuracy. The SD of measured $T_2$ varies less than 2% for $0.3 \leq TR4 \leq 1$ s, thus we choose the shortest TR within the scanner RF power limits). The SD of measured $T_2$ varied less than 3% for $20° \leq \theta_4 \leq 40°$, thus $\theta_4$=40° is an acceptable choice for higher SNR. With TR=0.6 s, $T_2$=80 ms, the error in $T_1$ of Tri-FA measurements decreases from 4±19% to 1.6±7.5% from $T_1$=0.3 to 1.5 s. With $T_1$=1 s, TR4=1.032 s, $\tau_1$=20 ms, $T_2$ error$\leq$0.4±27% up to $T_2$=190 ms.

Experiments

Figures 14A, 14B, 14C, 14D, 14E:
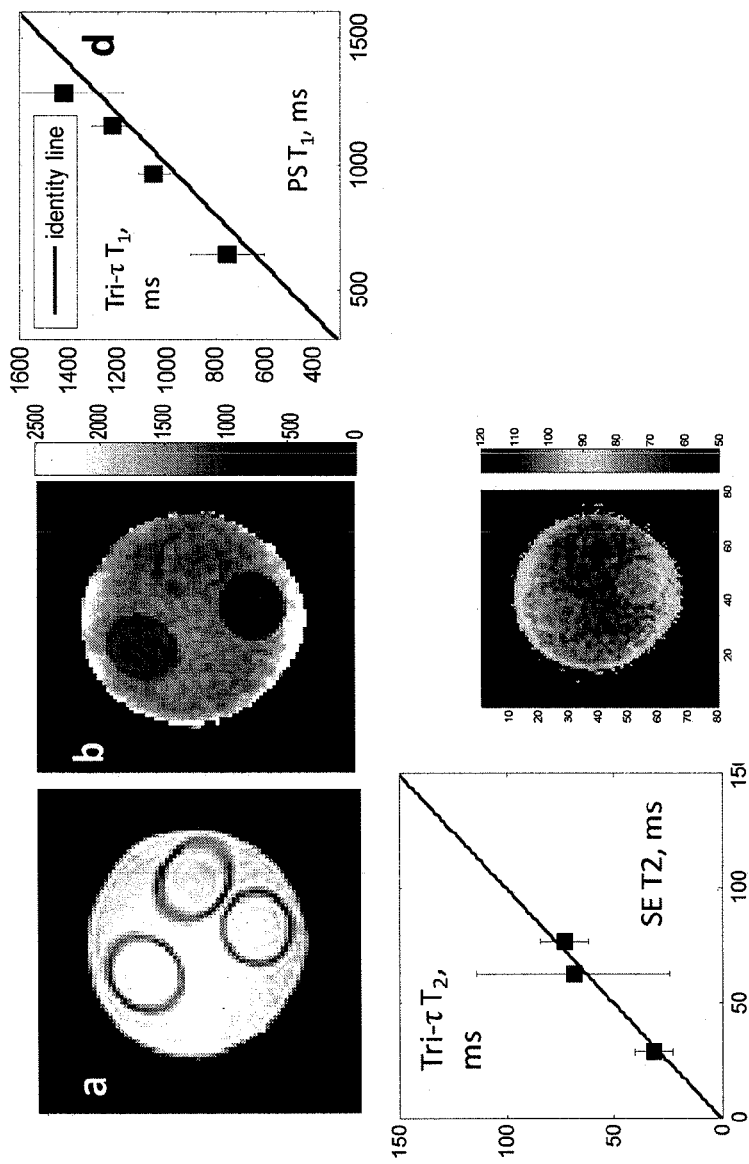
FIGS. 14A-14E show color coded Tri-τ PD(a), $T_1$(b) and $T_2$(c) map of the bottle phantom with three tubes immersed in the gel inside. The scale depicts $T_1$ and $T_2$ in ms. Tri-τ $T_1$ vs. PS $T_1$(d) and Tri-τ $T_2$ vs. SE $T_2$ is also plotted. $T_2$ values≥150 are not considered accurate for the operating conditions used for these studies. (e) the AFI $B_1$ map (referred to discussion).
Figures 15A, 15B, 15C:
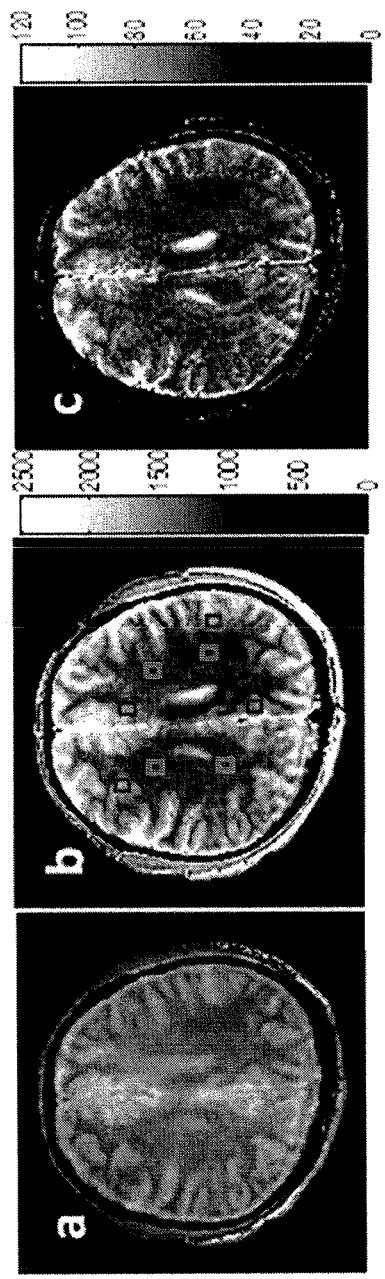
FIGS. 15A-15C shows color coded Tri-τ proton density (PD; a), $T_1$(b) and $T_2$(c) map of human brain. The $T_1$ and $T_2$ values in the annotated squares (green squares are in grey matter, GM, and blue squares are in white matter, WM) are compared with previous published values and SE $T_2$ values in Table 2.1.

The $T_1$, $T_2$, and PD images of the phantoms and human brain are shown in FIG. 14 and FIG. 15. Results of each phantom region are segmented with a region grow algorithm and compared with SE and PS values. $T_2$ values beyond 150 ms are not accurately determined by Tri-τ method for the acquisition parameters used in these particular experiments. $T_2$ of brain are compared with SE $T_2$ and $T_3$, $T_2$ values from annotated squares are compared with previous published literature [6-10] (Table 2.1). Tri-τ MRI results are also accurate as shown.

TABLE 2.1

Tri-τ T1 and T2 value of human brain in the annotated squares in FIG. 15 compared with previous published value and the SE T2.

| | $T_1$(ms) | $T_2$(ms) |
|---|---|---|
| GM (green squares) | 1654 ± 120 | 68 ± 9 |
| SE results | | 73 ± 5 |
| Previously reported | 1331 ± 13[6], 1470 ± 50[7], 1820 ± 114[8] | 71 ± 10[9], 99 ± 7[8], 110 ± 2[6] |
| WM (blue squares) | 1063 ± 84 | 54 ± 5 |
| SE results | | 66 ± 2 |
| Previously reported | 832 ± 10[6], 1084 ± 45[8], 1110 ± 45[7], 1110[10] | 56 ± 4[9], 69 ± 3[8], 80 ± 0.6[6] |

Figures 16A, 16B, 16C, 16D, 16E:
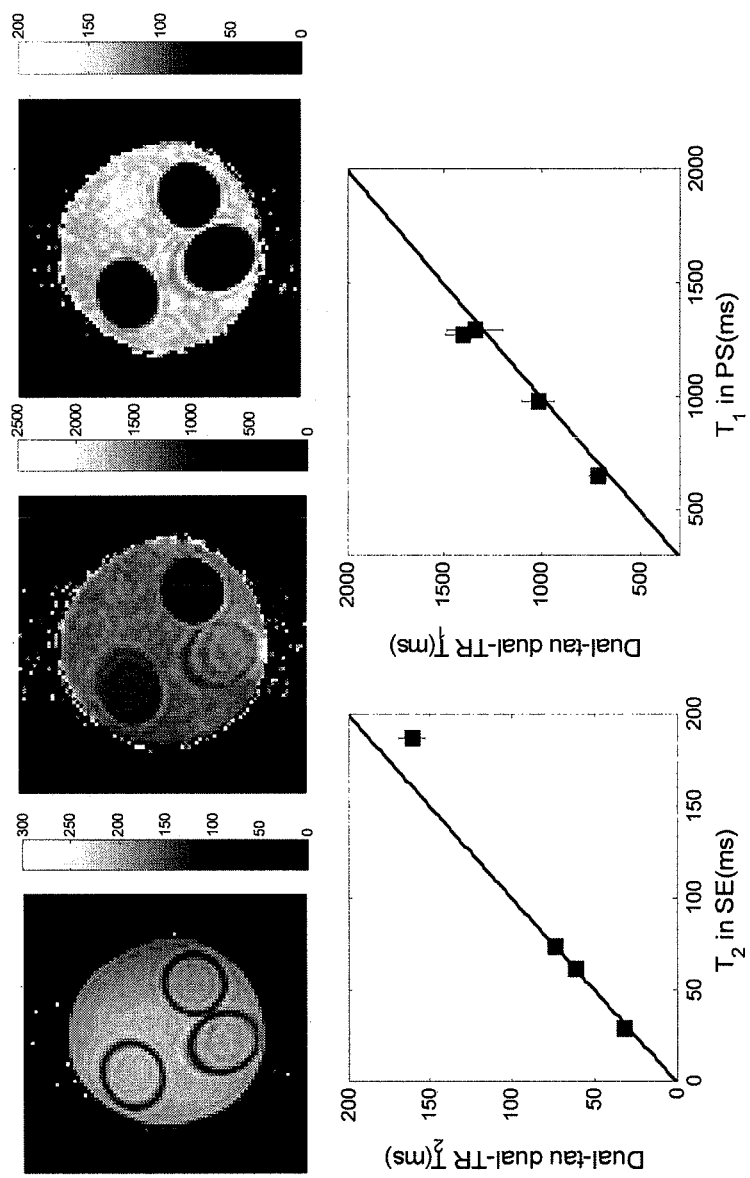
FIGS. 16A-16E shows Dual-tau-Dual-TR measurement results of PD(a), $T_1$(b) and $T_2$(c). The scale is the same as FIG. 14. Measured $T_1$ and $T_2$ in the four regions are compared with PS and SE measures of $T_1$ and $T_2$ in (d) and (e).

Results from a Dual-τ dual TR imaging experiment on a phantom, including a $T_1$, $T_2$ and a PD map and plots of the measured relaxation value vs. standard values are shown in FIG. 16. The mean $T_1$ error is 6.6±10.9% for 0.65≤$T_1$≤1.3 s and the mean $T_2$ error is 2.7%±5.2% for 29 ms≤$T_2$≤187 ms.

Figure 17:
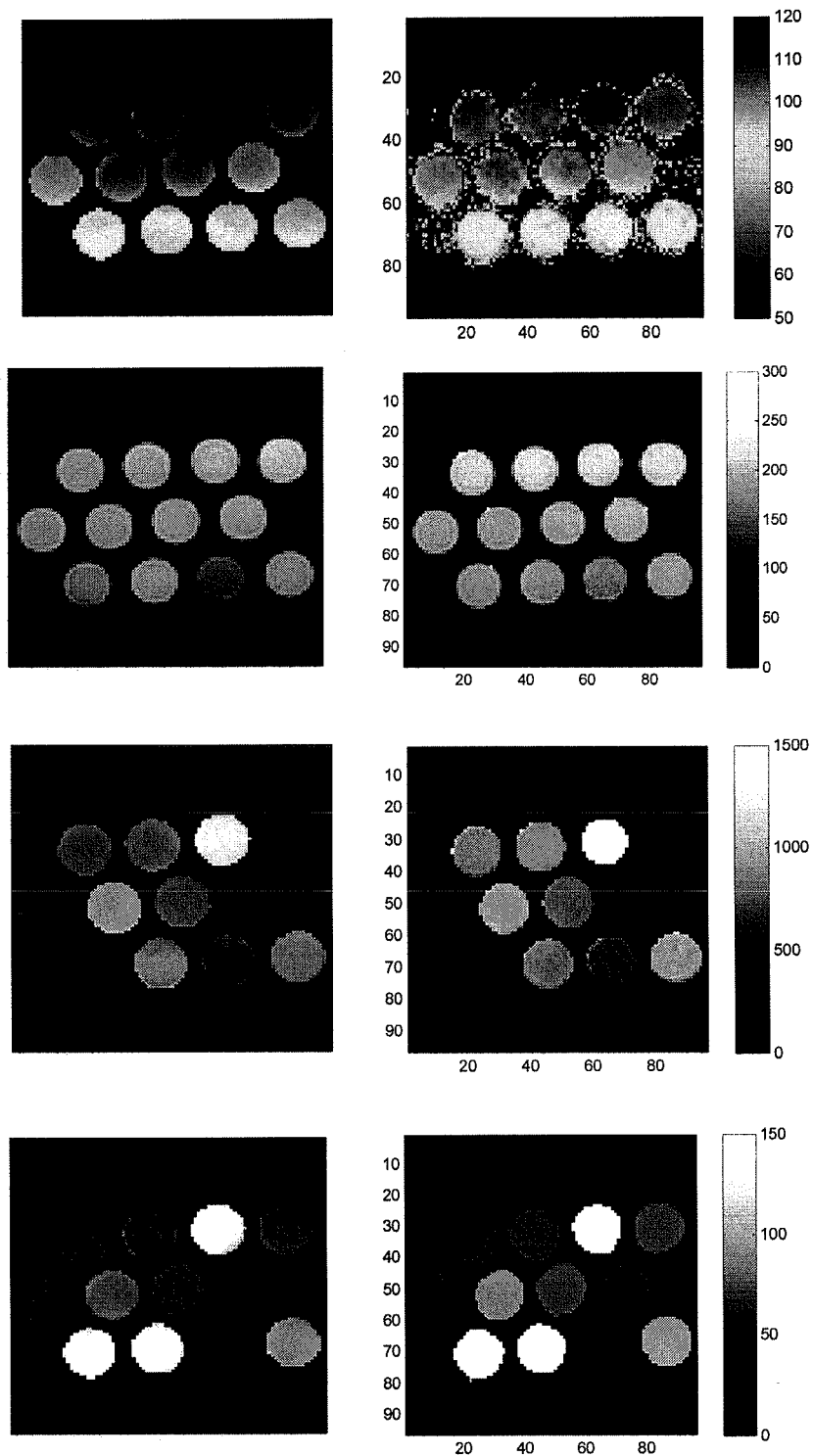
FIG. 17 shows Tri-FA results (column 1) compared with the standard values (column 2). Each row shares the same color scale. Row 1: $B_1$ power (%); Row 2: PD; Row 3: $T_1$ (ms); Row 4: $T_2$ (ms).
Figures 18A, 18B, 18C, 18D:
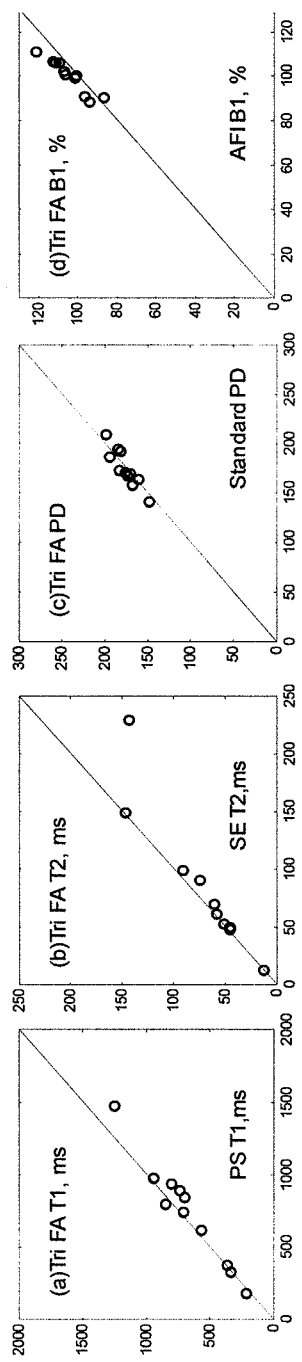
FIGS. 18A-18D show Tri-FA (a) $T_1$, (b) $T_2$, (c) PD, (d) $B_1$ result vs. standard value of each phantom.

Tri-FA $T_1$, $T_2$, PD, and $B_1$ maps, as compared with the standard maps, are shown in FIG. 17. The measured values vs. standard value are plotted in FIG. 18, excluding one nonuniform phantom. The $T_1$ error is 6.5%±9.6%, $T_2$ error is 11.1%±10.2%, $B_1$ error is 3.9%±3.6%, the $M_0$ or proton density error is 0.6%±4.6%. Note that one of the phantom $T_2$ values is beyond the accurate $T_2$ range for the Tri-FA embodiment. The $T_2$ error reduces to 8.4%±5.2% with that phantom excluded.

Discussion

As with conventional methods of measuring $T_1$ and $T_2$ separately, two of the embodiments of the present invention described herein require accurate knowledge of FA, and are sensitive to $B_1$ inhomogeneity when this is not known. This is resolved in the third embodiment which incorporates a $B_1$ determination as part of the acquisition. Of the embodiments presented, the Tri-τ $T_1$ and $T_2$ measurement appears most sensitive to $B_1$ inhomogeneity, while the Dual-τ/dual-TR embodiment produces homogeneous images, even in long $T_2$ samples. However, to obtain useful $T_2$ accuracy requires long pre-pulse lengths (τ2=20 ms), which can limit how short TR2 can be set due to scanner RF power limits. On the other hand, the Tri-FA embodiment provides a very wide range of accurate $T_1$ and $T_2$ measurements, even with relatively short τ=10 ms. In addition, it also provides accurate FAs, although the $T_2$ is determined from a single acquisition, instead of the ratio of two which may affect $T_2$ accuracy. As noted, the latter may be improved by including short-duration 0° adiabatics with the other 3 acquisition sequences.

References for Examples 2

[1] A.-M. El-Sharkawy, M. Schar, R. Ouwerkerk, R. G. Weiss, P. A. Bottomley, Quantitative Cardiac $^{31}$P Spectroscopy at 3 Tesla Using Adiabatic Paulses, Magnetic Resonance in Medicine, 61 (2009).

[2] P. A. Bottomley, R. Ouwerkerk, The Dual-Angle Method for Fast, Sensitive T1 Measurement in Vivo with Low-Angle Adiabatic Pulses, Journal of Magnetic Resonance, Series B, 104 (1994) 159-167.

[3] G. Wang, A. M. El-Sharkawy, W. A. Edelstein, M. Schar, P. A. Bottomley, Measuring T2 and T1, and imaging T2 without spin echoes, J. Magn. Reson., 214 (2012) 273-280.

[4] V. L. Yarnykh, Actual flip-angle imaging in the pulsed steady state: A method for rapid three-dimensional mapping of the transmitted radiofrequency field, Magnetic Resonance in Medicine, 57 (2007) 192-200.

[5] R. Venkatesan, W. Lin, E. M. Haacke, Accurate determination of spin-density and T1 in the presence of RF-field inhomogeneities and flip-angle miscalibration, Magnetic Resonance in Medicine, 40 (1998) 592-602.

[6] J. P. Wansapura, S. K. Holland, R. S. Dunn, W. S. Ball, NMR relaxation times in the human brain at 3.0 tesla, Journal of Magnetic Resonance Imaging, 9 (1999) 531-538.

[7] T. Ethofer, I. Mader, U. Seeger, G. Helms, M. Erb, W. Grodd, A. Ludolph, U. Klose, Comparison of longitudinal metabolite relaxation times in different regions of the human brain at 1.5 and 3 Tesla, Magnetic Resonance in Medicine, 50 (2003) 1296-1301.

[8] G. J. Stanisz, E. E. Odrobina, J. Pun, M. Escaravage, S. J. Graham, M. J. Bronskill, R. M. Henkelman, T1, $T_2$ relaxation and magnetization transfer in tissue at 3T, Magnetic Resonance in Medicine, 54 (2005) 507-512.

[9] N. Gelman, J. M. Gorell, P. B. Barker, R. M. Savage, E. M. Spickler, J. P. Windham, R. A. Knight, MR Imaging of Human Brain at 3.0 T: Preliminary Report on Transverse Relaxation Rates and Relation to Estimated Iron Content, Radiology, 210 (1999) 759-767.

[10] S. C. L. Deoni, High-resolution T1 mapping of the brain at 3T with driven equilibrium single pulse observation of T1 with high-speed incorporation of RF field inhomogeneities (DESPOT1-HIF1), Journal of Magnetic Resonance Imaging, 26 (2007) 1106-1111.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A system for measuring nuclear magnetic resonance spin-lattice relaxation time $T_1$ and spin-spin relaxation time $T_2$ of a sample, comprising:
    a source of a substantially uniform magnetic field $B_0$ for immersing at least a portion of said sample;
    a nuclear magnetic resonance excitation and detection system constructed and arranged to excite at least a portion of said sample with a plurality of nuclear magnetic resonance pulse sequences, each applied with a repetition time that is preselected to be sensitive to a $T_1$ value of at least a portion of said sample, and to detect nuclear magnetic resonance emissions from said sample in response to excitations to provide a plurality of detection signals; and
    a signal processing system configured to communicate with said nuclear magnetic resonance excitation and detection system to receive said plurality of detection signals,
    wherein said signal processing system is configured to process said plurality of detection signals to determine measured values for both $T_1$ and $T_2$ for said sample, wherein said plurality of nuclear magnetic resonance pulse sequences comprise at least a first pulse sequence that includes a non-adiabatic excitation pulse, a second pulse sequence that includes at least a first adiabatic pulse having a duration $\tau_2$, and a third pulse sequence that includes a second adiabatic pulse having a duration $\tau_3$ chosen to be sensitive to a $T_2$ value of at least a portion of said sample, and wherein each of said non-adiabatic pulses has a duration that is shorter than $\tau_2$, $\tau_3$ and $T_2$.

2. A system for measuring nuclear magnetic resonance spin-lattice relaxation time $T_1$ and spin-spin relaxation time $T_2$ of a sample according to claim 1, wherein $\tau_3$ is substantially twice as long as $\tau_2$.

3. A system for measuring nuclear magnetic resonance spin-lattice relaxation time $T_1$ and spin-spin relaxation time $T_2$ of a sample according to claim 1, wherein said non-adiabatic pulse in said first pulse sequence provides an excitation angle $\alpha$, and wherein both said first and second adiabatic pulses provide an excitation angle $\beta$.

4. A system for measuring nuclear magnetic resonance spin-lattice relaxation time $T_1$ and spin-spin relaxation time $T_2$ of a sample according to claim 1, wherein at least one of said adiabatic pulses is a $B_1$-independent rotation pulse, and wherein $B_1$ is a magnetic field component provided by said nuclear magnetic resonance pulse sequences.

5. A system for measuring nuclear magnetic resonance spin-lattice relaxation time $T_1$ and spin-spin relaxation time $T_2$ of a sample according to claim 1, wherein at least one of said first and second adiabatic pulses is a 0° adiabatic pulse, and wherein the at least one 0° adiabatic pulse is followed by at least one non-adiabatic pulse providing an excitation angle $\beta$.

6. A system for measuring nuclear magnetic resonance spin-lattice relaxation time $T_1$ and spin-spin relaxation time $T_2$ of a sample according to claim 5, further comprising a gradient magnetic field system constructed and arranged to apply at least one gradient magnetic field to provide spatial information, wherein said signal processing system is further configured to process said detection signal using said spatial information to construct an image of at least a portion of said sample.

7. A system for measuring nuclear magnetic resonance spin-lattice relaxation time $T_1$ and spin-spin relaxation time $T_2$ of a sample according to claim 1, wherein the plurality of nuclear magnetic resonance pulse sequences are applied with at least two different repetition periods.

8. A system for measuring nuclear magnetic resonance spin-lattice relaxation time $T_1$ and spin-spin relaxation time $T_2$ of a sample according to claim 7, wherein said first pulse sequence and said third pulse sequence are applied with a first repetition period TR1, and wherein said second pulse sequence is applied with a second repetition period TR2 that is substantially twice as long as TR1.

9. A system for measuring nuclear magnetic resonance spin-lattice relaxation time $T_1$ and spin-spin relaxation time $T_2$ of a sample according to claim 8, wherein said first pulse sequence also includes an adiabatic pulse of duration $T_1$.

10. A system for measuring nuclear magnetic resonance spin-lattice relaxation time $T_1$ and spin-spin relaxation time $T_2$ of a sample according to claim 9, wherein $\tau_1$ is substantially equal to $\tau_2$, and wherein $\tau_3$ is substantially twice as long as $\tau_2$.

11. A system for measuring nuclear magnetic resonance spin-lattice relaxation time $T_1$ and spin-spin relaxation time $T_2$ of a sample according to claim 10, wherein at least one of said adiabatic pulses is a 0° adiabatic pulse, and wherein the at least one 0° adiabatic pulse is followed by at least one non-adiabatic pulse providing an excitation angle $\alpha$.

12. A system for measuring nuclear magnetic resonance spin-lattice relaxation time $T_1$ and spin-spin relaxation time $T_2$ of a sample according to claim 11, wherein all adiabatic pulses in said first, said second and said third pulse sequences are 0° adiabatic pulses followed by non-adiabatic pulses with the same excitation angle $\alpha$.

13. A system for measuring nuclear magnetic resonance spin-lattice relaxation time $T_1$ and spin-spin relaxation time $T_2$ of a sample according to claim 11, further comprising a gradient magnetic field system constructed and arranged to apply at least one gradient magnetic field to provide spatial information, wherein said signal processing system is further configured to process said detection signal using said spatial information to construct an image of at least a portion of said sample.

14. A system for measuring nuclear magnetic resonance spin-lattice relaxation time $T_1$ and spin-spin relaxation time $T_2$ of a sample according to claim 1, wherein said adiabatic pulses have respective duration values in a range of 3 ms to 60 ms.

15. A method of measuring nuclear magnetic resonance spin-lattice relaxation time $T_1$ and spin-spin relaxation time $T_2$ of a sample, comprising:

immersing said sample in a substantially uniform magnetic field $B_0$;

exciting at least a portion of said sample with a plurality of nuclear magnetic resonance pulse sequences, each applied with a repetition time that is preselected to be sensitive to a $T_1$ value of at least a portion of said sample;

detecting nuclear magnetic resonance emissions from said sample in response to said exciting to provide a plurality of detection signals; and processing said detection signals to determine measured values for both $T_1$ and $T_2$ for said sample, wherein said plurality of nuclear magnetic resonance pulse sequences comprise at least a first pulse sequence that includes a non-adiabatic excitation pulse, a second pulse sequence that includes at least a first adiabatic pulse having a duration $\tau_2$, and a third pulse sequence that includes a second adiabatic pulse having a duration $\tau_3$ chosen to be sensitive to a $T_2$ value of at least a portion of said sample, and wherein each of said non-adiabatic pulses has a duration that is shorter than $\tau_2$, $\tau_3$ and $T_2$.

16. A method of measuring nuclear magnetic resonance spin-lattice relaxation time $T_1$ and spin-spin relaxation time $T_2$ of a sample according to claim 15, wherein $\tau_3$ is substantially twice as long as $\tau_2$.

17. A method of measuring nuclear magnetic resonance spin-lattice relaxation time $T_1$ and spin-spin relaxation time $T_2$ of a sample according to claim 15, wherein said non-adiabatic pulse in said first pulse sequence provides an excitation angle $\alpha$, and wherein both said first and second adiabatic pulses provide an excitation angle $\beta$.

18. A method of measuring nuclear magnetic resonance spin-lattice relaxation time $T_1$ and spin-spin relaxation time $T_2$ of a sample according to claim 15,
wherein at least one of said adiabatic pulses is a $B_1$-independent rotation pulse, and
wherein $B_1$ is a magnetic field component provided by said nuclear magnetic resonance pulse sequences.

19. A method of measuring nuclear magnetic resonance spin-lattice relaxation time $T_1$ and spin-spin relaxation time $T_2$ of a sample according to claim 15,
wherein at least one of said first and second adiabatic pulses is a 0° adiabatic pulse, and
wherein the at least one 0° adiabatic pulse is followed by at least one non-adiabatic pulse providing an excitation angle β.

20. A method of measuring nuclear magnetic resonance spin-lattice relaxation time $T_1$ and spin-spin relaxation time $T_2$ of a sample according to claim 19, further comprising applying at least one gradient magnetic field to provide spatial information,
wherein said processing said detection signal uses said spatial information to construct an image of at least a portion of said sample.

21. A method of measuring nuclear magnetic resonance spin-lattice relaxation time $T_1$ and spin-spin relaxation time $T_2$ of a sample according to claim 15,
wherein the plurality of nuclear magnetic resonance pulse sequences are applied with at least two different repetition periods.

22. A method of measuring nuclear magnetic resonance spin-lattice relaxation time $T_1$ and spin-spin relaxation time $T_2$ of a sample according to claim 21,
wherein said first pulse sequence and said third pulse sequence are applied with a first repetition period TR1, and
wherein said second pulse sequence is applied with a second repetition period TR2 that is substantially twice as long as TR1.

23. A method of measuring nuclear magnetic resonance spin-lattice relaxation time $T_1$ and spin-spin relaxation time $T_2$ of a sample according to claim 22,
wherein said first pulse sequence also includes an adiabatic pulse of duration $\tau_1$.

24. A method of measuring nuclear magnetic resonance spin-lattice relaxation time $T_1$ and spin-spin relaxation time $T_2$ of a sample according to claim 23,
wherein $\tau_1$ is substantially equal to $\tau_2$, and
wherein $\tau_3$ is substantially twice as long as $\tau_2$.

25. A method of measuring nuclear magnetic resonance spin-lattice relaxation time $T_1$ and spin-spin relaxation time $T_2$ of a sample according to claim 24,
wherein at least one of said adiabatic pulses is a 0° adiabatic pulse, and
wherein the at least one 0° adiabatic pulse is followed by at least one non-adiabatic pulse providing an excitation angle α.

26. The method of claim 25, wherein all adiabatic pulses in said first, said second and said third pulse sequences are 0° adiabatic pulses followed by non-adiabatic pulses with the same excitation angle α.

27. A method of measuring nuclear magnetic resonance spin-lattice relaxation time $T_1$ and spin-spin relaxation time $T_2$ of a sample according to claim 25, further comprising applying at least one gradient magnetic field to provide spatial information,
wherein said processing said detection signal uses said spatial information to construct an image of at least a portion of said sample.

28. A method of measuring nuclear magnetic resonance spin-lattice relaxation time $T_1$ and spin-spin relaxation time $T_2$ of a sample according to claim 15,
wherein said adiabatic pulses have respective duration values in a range of 3 ms to 60 ms.

29. A method of measuring nuclear magnetic resonance spin-lattice relaxation time $T_1$ and spin-spin relaxation time $T_2$ of a sample with improved correction for nonuniformity in a $B_1$ magnetic field component, comprising:
immersing said sample in a substantially uniform magnetic field $B_0$;
exciting at least a portion of said sample with a plurality of nuclear magnetic resonance pulse sequences, each applied with a repetition period that is preselected to be sensitive to a $T_1$ value of at least a portion of said sample;
detecting nuclear magnetic resonance emissions from said sample in response to said plurality of nuclear magnetic resonance pulse sequences to provide a plurality of detection signals; and
processing said detection signals to determine measured values for both $T_1$ and $T_2$ for said sample,
wherein said plurality of nuclear magnetic resonance pulse sequences comprise at least first, second, third and fourth pulse sequences, wherein each of said first, second, third and fourth pulse sequences include at least one excitation pulse with excitation angles $\theta_1$, $\theta_2$, $\theta_3$, $\theta_4$, respectively,
wherein at least one of said first, second, third and fourth pulse sequences includes an adiabatic pulse having a duration $\tau_1$ chosen to be sensitive to a $T_2$ value of at least a portion of said sample, and
wherein $B_1$ is a magnetic field component provided by said plurality of nuclear magnetic resonance pulse sequences.

30. The method of claim 29, wherein each of the first, second, and third excitation pulses is a non-adiabatic pulse, and
wherein each of the first, second and third pulse sequences are applied with a same repetition period.

31. The method of claim 30, wherein said adiabatic pulse is a 0° adiabatic pulse, and
wherein said adiabatic pulse is followed by a non-adiabatic pulse with an excitation angle $\theta_4$.

32. A method of measuring nuclear magnetic resonance spin-lattice relaxation time $T_1$ and spin-spin relaxation time $T_2$ of a sample according to claim 29, further comprising applying at least one gradient magnetic field to provide spatial information,
wherein said processing said detection signal uses said spatial information to construct an image of at least a portion of said sample.

33. The method of claim 29, wherein $\theta_1$ has a value in a range 25°-60°, $\theta_2$ has a value in a range 50°–120°, and $\theta_3$ has a value in a range 110° to less than 180°.

34. The method of claim 29, wherein a plurality of said pulse sequences each include an adiabatic pulse,
wherein an adiabatic pulse that is applied in a second pulse sequence has a duration $\tau_2$, an adiabatic pulse that is applied in a third pulse sequence has a duration $\tau_3$, and an adiabatic pulse that is applied in a fourth pulse sequence has a duration $\tau_4$.

35. The method of claim 34, wherein all of said first, second, third and fourth pulse sequences include adiabatic pulses,
wherein each adiabatic pulse is a 0° adiabatic pulse followed respectively by a non-adiabatic pulse with an excitation angle $\theta_1$, $\theta_2$, $\theta_3$, and $\theta_4$, and
wherein a duration of at least one of the adiabatic pulses is substantially less than said duration $\tau_1$.

36. The method of claim 35, wherein $\tau_2$, $\tau_3$, and $\tau_4$, are substantially equal and less than $\tau_1$.

37. The method of claim 35, further comprising applying at least one gradient magnetic field to provide spatial information,
wherein said processing said detection signal uses said spatial information to construct an image of at least a portion of said sample.

38. The method of claim 34, wherein at least one of said adiabatic pulses is a $B_1$-independent rotation pulse.

39. The method of claim 29, wherein a duration of said adiabatic pulse has a value in a range of 3 ms to 60 ms.

40. A system for measuring nuclear magnetic resonance spin-lattice relaxation time $T_1$ and spin-spin relaxation time $T_2$ of a sample with improved correction for nonuniformity in a $B_1$ magnetic field component, comprising:
a source of a substantially uniform magnetic field $B_0$ for immersing at least a portion of said sample;
a nuclear magnetic resonance excitation and detection system constructed and arranged to excite at least a portion of said sample with a plurality of nuclear magnetic resonance pulse sequences, each applied with a repetition period that is preselected to be sensitive to a $T_1$ value of at least a portion of said sample, and to detect nuclear magnetic resonance emissions from said sample in response to excitations to provide a plurality of detection signals;
a signal processing system configured to communicate with said nuclear magnetic resonance excitation and detection system to receive said plurality of detection signals,
wherein said signal processing system is configured to process said plurality of detection signals to determine measured values for both $T_1$ and $T_2$ for said sample,
wherein said plurality of nuclear magnetic resonance pulse sequences comprise at least first, second, third and fourth pulse sequences, wherein each of said first, second, third and fourth pulse sequences include at least one excitation pulse with excitation angles $\theta_1$, $\theta_2$, $\theta_3$, $\theta_4$, respectively,
wherein at least one of said first, second, third and fourth pulse sequences includes an adiabatic pulse having a duration $\tau_1$ chosen to be sensitive to a $T_2$ value of at least a portion of said sample, and wherein $B_1$ is a magnetic field component provided by said plurality of nuclear magnetic resonance pulse sequences.

41. The system of claim 40, wherein each of the first, second, and third excitation pulses is a non-adiabatic pulse, and
wherein each of the first, second and third pulse sequences are applied with a same repetition period.

42. The system of claim 41, wherein said adiabatic pulse is a 0° adiabatic pulse, and
wherein said adiabatic pulse is followed by a non-adiabatic pulse with an excitation angle $\theta_4$.

43. A system of claim 40, further comprising a gradient magnetic field system constructed and arranged to apply at least one gradient magnetic field to provide spatial information,
wherein said signal processing system is further configured to process said detection signal using said spatial information to construct an image of at least a portion of said sample.

44. The system of claim 40, wherein $\theta_1$ has a value in a range 25°-60°, $\theta_2$ has a value in a range 50°-120°, and $\theta_3$ has a value in a range 110° to less than 180°.

45. The system of claim 40, wherein a plurality of said pulse sequences each include an adiabatic pulse, and
wherein an adiabatic pulse that is applied in a second pulse sequence has a duration $\tau_2$, an adiabatic pulse that is applied in a third pulse sequence has a duration $\tau_3$, and an adiabatic pulse that is applied in a fourth pulse sequence has a duration $\tau_4$.

46. The system of claim 45, wherein all of said first, second, third and fourth pulse sequences include adiabatic pulses,
wherein each adiabatic pulse is a 0° adiabatic pulse followed respectively by a non-adiabatic pulse with an excitation angle $\theta_1$, $\theta_2$, $\theta_3$, and $\theta_4$, and
wherein a duration of at least one of the adiabatic pulses is substantially less than said duration $\tau_1$.

47. The system of claim 46, wherein $\tau_2$, $\tau_3$, and $\tau_4$, are substantially equal and less than $\tau_1$.

48. The system of claim 46, further comprising a gradient magnetic field system constructed and arranged to apply at least one gradient magnetic field to provide spatial information,
wherein said signal processing system is further configured to process said detection signal using said spatial information to construct an image of at least a portion of said sample.

49. The system of claim 45, wherein at least one of said adiabatic pulses is a $B_1$-independent rotation pulse.

50. The system of claim 40, wherein a duration of said adiabatic pulse has a value in a range of 3 ms to 60 ms.

* * * * *